United States Patent
Min et al.

(10) Patent No.: US 9,888,595 B2
(45) Date of Patent: Feb. 6, 2018

(54) DISPLAY DEVICE

(71) Applicant: LG ELECTRONICS INC., Seoul (KR)

(72) Inventors: Bumgi Min, Seoul (KR); Mingeun Jeong, Seoul (KR); Cheolsoo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/174,461

(22) Filed: Jun. 6, 2016

(65) Prior Publication Data

US 2017/0034936 A1 Feb. 2, 2017

(30) Foreign Application Priority Data

Jul. 31, 2015 (KR) ........................ 10-2015-0109132

(51) Int. Cl.
| G06F 1/16 | (2006.01) |
|---|---|
| H05K 5/02 | (2006.01) |
| F16M 11/04 | (2006.01) |
| G02F 1/1333 | (2006.01) |
| H01L 51/52 | (2006.01) |
| H05K 5/00 | (2006.01) |

(52) U.S. Cl.
CPC ........... *H05K 5/0234* (2013.01); *F16M 11/04* (2013.01); *G02F 1/133308* (2013.01); *H01L 51/5237* (2013.01); *H05K 5/0017* (2013.01); *G02F 2001/133322* (2013.01); *G02F 2201/46* (2013.01)

(58) Field of Classification Search
CPC ...... H05K 5/02; H05K 5/0017; H05K 5/0234; H05K 5/00; F16M 11/04; G02F 1/133308; G02F 2001/133322; G02F 2201/46; H01L 51/5237; G06F 1/16; G06F 1/1601; G06F 1/18; G06F 1/181
USPC .................... 361/679.01, 671.22; 349/58–60
See application file for complete search history.

(56) References Cited

U.S. PATENT DOCUMENTS

| 4,333,978 A * | 6/1982 | Kocher ................ A41D 27/245 |
|---|---|---|
| | | 156/164 |
| 8,212,955 B2 * | 7/2012 | Tang ................. G02F 1/133608 |
| | | 349/56 |
| 2006/0145576 A1 | 7/2006 | Lee et al. |
| 2011/0267840 A1 * | 11/2011 | Wu ........................ G09F 13/22 |
| | | 362/611 |
| 2013/0027851 A1 * | 1/2013 | Liao ..................... G06F 1/1616 |
| | | 361/679.01 |

(Continued)

FOREIGN PATENT DOCUMENTS

WO 2015/081714 A1 6/2015

*Primary Examiner* — Anthony Haughton
*Assistant Examiner* — Ingrid Wright
(74) *Attorney, Agent, or Firm* — Dentons US LLP

(57) ABSTRACT

A display device is disclosed. The display device includes a display unit including a display panel, a back cover positioned on a back surface of the display panel, and a light shielding plate positioned between the display panel and the back cover, a housing into which at least a portion of a lower area of the display unit is inserted, and on which a substrate is mounted, a link bar connecting the housing to the display unit, and a tension bracket positioned inside the housing and disposed between the display unit and a bottom surface of the housing, the display unit being safely placed on the tension bracket.

18 Claims, 37 Drawing Sheets

(56) References Cited

U.S. PATENT DOCUMENTS

2013/0077230 A1\* 3/2013 Jeon .................... G11B 33/022
                                              361/679.33
2013/0223013 A1   8/2013 Hwang
2014/0092542 A1\* 4/2014 Nishi ..................... G06F 1/1616
                                              361/679.06

\* cited by examiner

DISPLAY DEVICE

This application claims the benefit of Korean Patent Application No. 10-2015-0109132 filed on Jul. 31, 2015, the entire contents of which is hereby incorporated by reference in its entirety.

BACKGROUND OF THE DISCLOSURE

Field of the Disclosure

The present disclosure relates to a display device, and more particularly to a display device for reducing an impact applied to a lower part of a display unit and guiding accurately placing the display unit on a housing by disposing a tension bracket between the display unit and the housing.

Background of the Disclosure

With the development of the information society, various demands for display devices have been increasing. Various display devices, such as liquid crystal displays (LCDs), plasma display panels (PDPs), electroluminescent displays (ELDs), and vacuum fluorescent displays (VFDs), have been recently studied and used to meet various demands for the display devices.

Among the various display devices, a display device using organic light emitting diodes (OLEDs) is more excellent than the liquid crystal display in terms of a luminance and a viewing angle. Further, the display device using the OLEDs does not require a backlight unit unlike the liquid crystal display, and thus can be implemented as an ultra-thin profile display device.

Unlike a related art display device, it is recently required to maximize aesthetic characteristic and applicability of a display device by transparently maintaining a display panel in an inactive state, in which an image is not displayed, so that a background of a back surface of the display panel is seen.

SUMMARY OF THE DISCLOSURE

In one aspect, there is provided a display device comprising a display unit including a display panel, a back cover positioned on a back surface of the display panel, and a light shielding plate positioned between the display panel and the back cover, a housing into which at least a portion of a lower area of the display unit is inserted, a substrate being mounted on the housing, a link bar connecting the housing to the display unit, and a tension bracket positioned inside the housing and disposed between the display unit and a bottom surface of the housing, the display unit being safely placed on the tension bracket.

The tension bracket may include a receiving portion, on which the display unit is mounted, a guide portion protruding to one side of the receiving portion in a thickness direction of the tension bracket and inclined to the receiving portion, and fastening portions respectively positioned at both ends of the guide portion in a longitudinal direction vertical to the thickness direction of the tension bracket, the fastening portions coupling with the housing.

The receiving portion may include at least one groove which is separated from one another by a predetermined distance in the thickness direction and extends in the longitudinal direction.

The receiving portion may be separated from the housing by a predetermined distance.

An upper surface of the guide portion may be round in shape.

The fastening portions may be coupled with the housing through at least one screw.

The tension bracket may be in plural. The plurality of tension brackets may be separated from one another by a predetermined distance in a longitudinal direction of the housing.

A width of the tension bracket, in the longitudinal direction, positioned in the middle of the plurality of tension brackets may be greater than a width of other tension bracket in the longitudinal direction.

The tension bracket may include a material with high elasticity.

At least a portion of the link bar may be positioned between a lower portion of the display unit and the tension bracket.

The printed circuit board may lie on the housing in a direction vertical to an extending direction of the display panel.

The display device may further comprise a front cover covering an upper surface of the housing at a front surface of the display unit, and a rear cover covering the upper surface of the housing at a back surface of the display unit.

The front cover and the rear cover may be coupled with the housing using a front hook protruding toward the housing and a rear hook protruding toward the bottom surface of the housing.

The front cover may include a support which protrudes toward the bottom surface of the housing and contacts the bottom surface of the housing.

The display device may further comprise a cushion positioned between the display unit and the back cover and absorbing an impact.

The cushion may be in plural. One cushion may be positioned between the tension bracket and the link bar, and other cushion may be positioned between the link bar and the display unit.

The back cover may include a transparent material.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
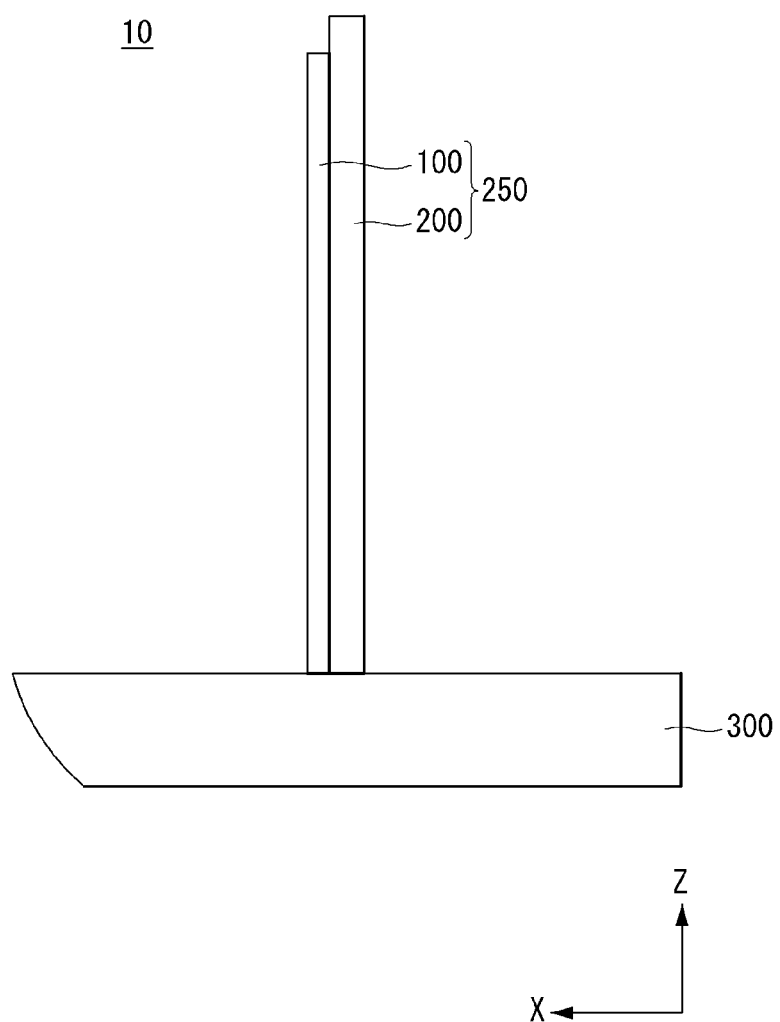
FIGS. 1 to 7 illustrate configuration of a display device according to an example embodiment of the invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component (s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms 'include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, embodiments of the invention are described using an organic light emitting diode (OLED) display panel as an example of a display panel. Other display panels may be used. For example, a plasma display panel (PDP), a field emission display (FED) panel, and a liquid crystal display panel may be used.

FIGS. 1 to 7 illustrate configuration of a display device according to an example embodiment of the invention.

Referring to FIG. 1, a display device 10 according to an example embodiment of the invention may include a display unit 250 and a housing 300.

The display unit 250 may include a display panel 100 and a back cover 200. The display panel 100 may be provided at a front surface of the display device 10 and may display an image. The display panel 100 may divide the image into a plurality of pixels and may output the image while controlling color, brightness, and chroma of each pixel.

The display panel 100 may have a rectangular shape. Other shapes may be used. For example, the display panel 100 may have a shape having a predetermined curvature at an edge. The display panel 100 may an OLED display panel. Other display panels may be used. For example, a liquid crystal display panel may be used as the display panel 100.

The back cover 200 may be provided at a back surface of the display panel 100. The back cover 200 may be directly attached to the display panel 100, but is not limited thereto. Other components may be positioned between the back cover 200 and the display panel 100. The size of the back cover 200 may be equal to or greater than the size of the display panel 100.

The back cover 200 may support the back surface of the display panel 100. Hence, the back cover 200 may include a lightweight material having high rigidity.

The housing 300 may be positioned under the display unit 250. The housing 300 may support a lower part of the display unit 250 and may prevent the display unit 250 from leaning to one side. The housing 300 may have a shape, in which an entire surface of at least one side has curvature. Hence, an appearance of the display device 10 may be improved.

The housing 300 may shield components for driving the display device 10. For example, the housing 300 may shield at least one printed circuit board (PCB). A connection structure and a connection method of at least one PCB are described in detail later.

The housing 300 may receive electromagnetic waves emitted from at least one PCB. Hence, although not shown, the housing 300 may include an inner housing formed of a conductive material and an outer housing covering the inner housing. Other configurations may be used. For example, the housing 300 may be one body formed of a conductive material.

Figure 2:
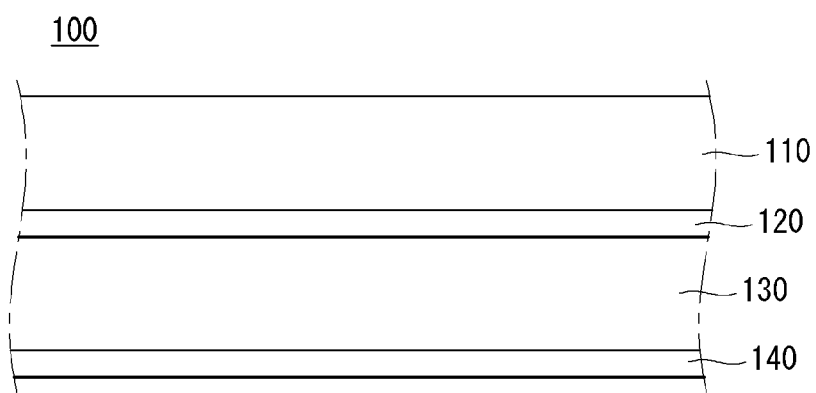

Referring to FIG. 2, the display panel 100 may include a transparent substrate 110, an upper electrode 120, an organic light emitting layer 130, and a lower electrode 140. The transparent substrate 110, the upper electrode 120, the organic light emitting layer 130, and the lower electrode 140 may be sequentially formed.

The transparent substrate 110 and the upper electrode 120 may include a transparent material. The lower electrode 140 may include a material which is not transparent, but is not limited thereto. The lower electrode 140 may include a transparent material, for example, indium titanium oxide (ITO). In this instance, light may be emitted from one surface of the lower electrode 140.

When a voltage is applied to the upper electrode 120 and the lower electrode 140, light emitted from the organic light emitting layer 130 may pass through the upper electrode 120 and the transparent substrate 110 and may be emitted to the outside. In this instance, a light shielding plate may be additionally formed behind the lower electrode 140, so as to emit light emitted to the lower electrode 140 to the front.

The display device 10 according to the embodiment of the invention may be an OLED display. The OLED display does not require a separate light source and thus can reduce a volume and a weight of the display device 10. Because a response speed of the OLED display is more than 1,000 times a response speed of a liquid crystal display, image retention may not be generated in the OLED display when the OLED display displays an image.

Figure 3:
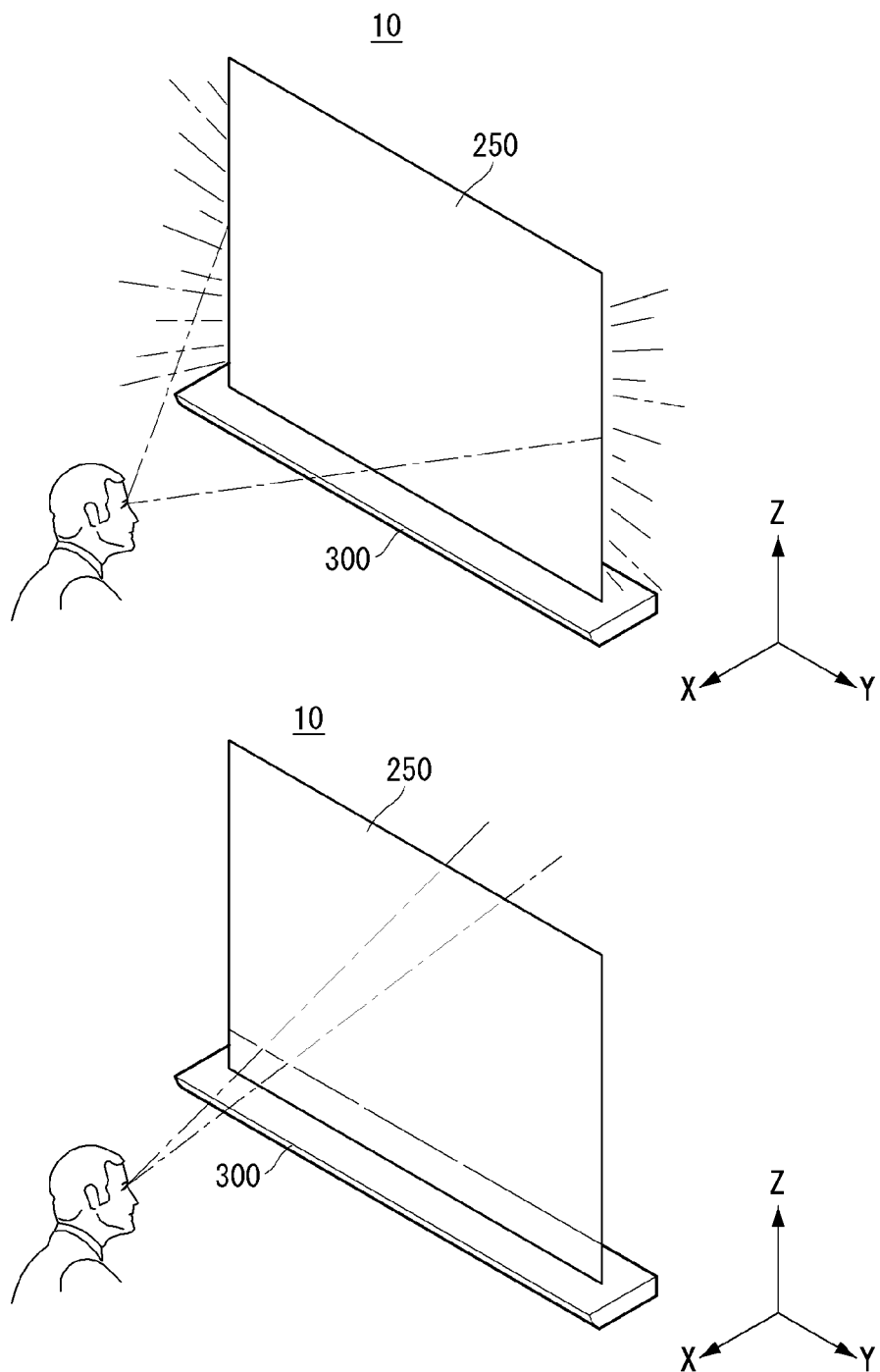

Referring to FIG. 3, the display unit 250 of the display device 10 according to the embodiment of the invention may include a transparent material. This may mean that the back cover 200 includes the transparent material. For example, the back cover 200 may include glass or tempered glass.

When the display device 10 is driven, a user may watch an image or a screen displayed on the display unit 250. When a drive of the display device 10 ends, the user may observe backgrounds positioned in the rear of the display unit 250.

The display unit 250 of the display device 10 according to the embodiment of the invention may be transparent. Thus, the user may feel that the appearance of the display device is neat and attractive.

Figure 4:
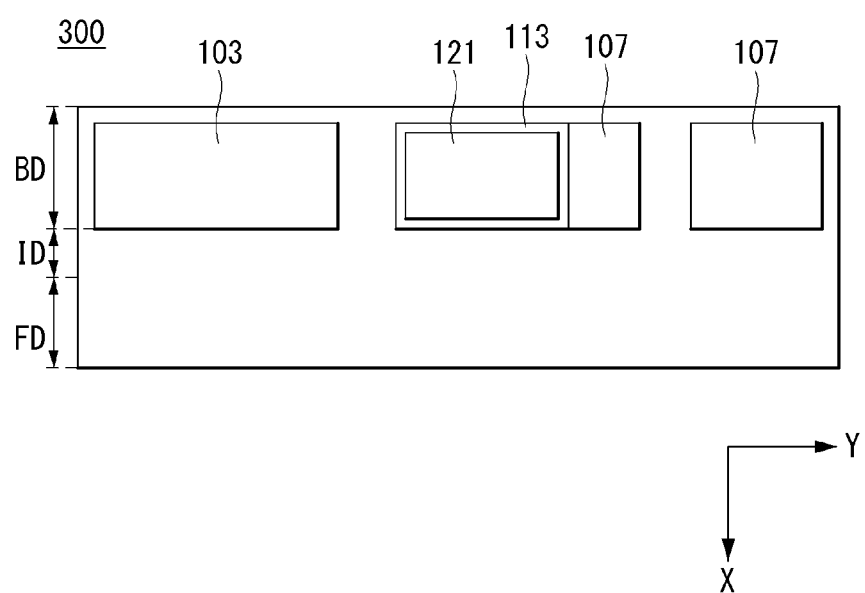

Referring to FIG. 4, the housing 300 may include a back part, a mount part, and a front part. The mount part may be a part coupled with the display unit 250, and the back part and the front part may be parts respectively positioned at a back surface and a front surface of the display unit 250.

A length FD of the front part in a thickness direction (for example, X-axis direction) may be longer than a length BD of the back part in the thickness direction. Because the length BD of the back part is shorter than the length FD of the front part, the user can concentrate on the screen of the display unit 250 without a hindrance of the housing 300.

Because a space of the back part of the housing 300 is wider than other parts, at least one substrate may be mounted on the back part of the housing 300. At least one substrate may be at least one PCB. The PCB may lie on the housing 300 and may be mounted on the housing 300. An extension direction of the PCB may be vertical to an extension direction of the display panel. For example, the PCB may extend in the X-axis direction or Y-axis direction on the housing 300.

The PCBs may be positioned to be separated from each other. The PCBs may perform different functions. For example, at least one PCB may be a main board 103. The main board 103 may provide an interface for operating the display device. Further, the main board 103 may check and control an operation state of the components of the display device and thus may make the components of the display device in an optimum state. For example, the main board 103 may be mounted on at least one side of the back part of the housing 300.

As another example, at least one PCB may be a power supply board 107. The power supply board 107 may supply electric power to the display device. The power supply board 107 may convert an AC frequency into a DC frequency. Namely, the power supply board 107 may convert a low frequency into a high frequency and may improve electrical efficiency.

The power supply board 107 may be separated from the main board 103 by a predetermined distance. For example, one power supply board 107 may be positioned in the middle of the back part of the housing 300, and another power supply board 107 may be positioned on the opposite side of the main board 103 in a longitudinal direction (for example, Y-axis direction) of the housing 300. Other configurations may be used. For example, only one power supply board 107 may be positioned in the middle of the back part of the housing 300.

As another example, at least one PCB may be a timing controller board 121. The timing controller board 121 may transmit an input signal to the display panel 100. Namely, the timing controller board 121 may transmit timing signals CLK, LOAD, and SPi for controlling a source PCB and video signals R, G, and B to the source PCB. Further, the timing controller board 121 may control the image. The timing controller board 121 may be connected to the source PCB through flat flexible cables (FFCs).

The timing controller board 121 may be positioned in the middle of the back part of the housing 300. Namely, the timing controller board 121 may be mounted on an upper surface of the power supply board 107. Because the timing controller board 121 is positioned on the upper surface of the power supply board 107, an internal space of the housing 300 may be saved.

A timing controller shield 113 may be attached to a location where the timing controller board 121 will be mounted, so as to block electromagnetic waves emitted from the power supply board 107. Namely, the timing controller board 121 may be connected to not the power supply board 107 but the timing controller shield 113. Hence, the timing controller board 121 and the power supply board 107 may not interfere with each other.

Figure 5:
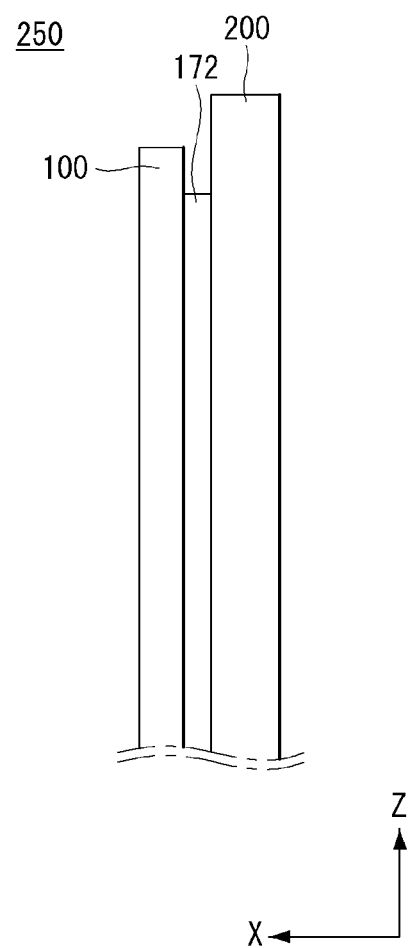

Referring to FIG. 5, a light shielding plate 172 may be positioned between the display panel 100 and the back cover 200. The light shielding plate 172 may reflect light emitted to the back cover 200, causing the light to travel toward the front surface of the display panel 100. Hence, the light shielding plate 172 may increase a luminance of the display panel 100.

When the display panel 100 is driven (i.e., the display panel 100 displays the image on the screen), the light shielding plate 172 may block light. When the display panel 100 is not driven, the light shielding plate 172 may transmit light. This may vary depending on an arrangement of liquid crystals positioned inside the light shielding plate 172.

Further, when the display panel 100 is driven, the light shielding plate 172 may transmit light. In this instance, the user may simultaneously watch the screen of the display panel 100 and the background positioned in the rear of the display device.

The light shielding plate 172 may include a material having a thermal expansion coefficient different from the display panel 100. For example, the light shielding plate 172 may include a material having a thermal expansion coefficient greater than a thermal expansion coefficient of the display panel 100. Hence, the light shielding plate 172 may expand more than the display panel 100 at a high temperature or a high humidity. Thus, a height of the light shielding plate 172 may be less than a height of the display panel 100, so that the light shielding plate 172 is not exposed to the outside of the display panel 100.

In the display device 10 according to the embodiment of the invention, the light shielding plate 172 may be positioned on the back surface of the display panel 100. Hence, the user can watch a clearer screen when the screen is displayed on the display panel 100.

Figure 6:
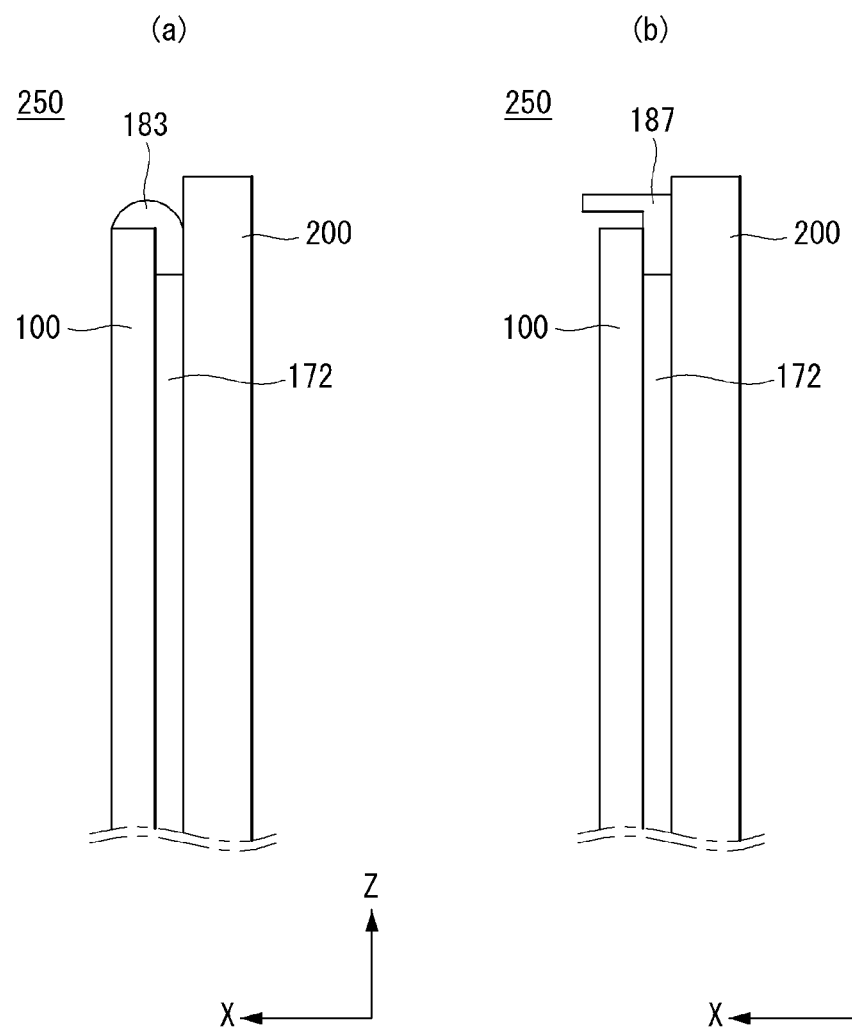

Referring to FIG. 6, because the height of the light shielding plate 172 is less than the height of the display panel 100 as described above, foreign substances, for example, dust may enter between the light shielding plate 172 and the display panel 100. Further, a crack may be generated in an exposed upper surface of the light shielding plate 172 and an exposed upper surface of the display panel 100.

For example, as shown in (a) of FIG. 6, a sealing member 183 may be side-sealed to the upper surface of the light shielding plate 172 and the upper surface of the display panel 100, so as to prevent the foreign substances and the crack. The sealing member 183 may simultaneously cover the upper surface of the light shielding plate 172 and the upper surface of the display panel 100.

As another example, as shown in (b) of FIG. 6, a frame 187 may be inserted into the upper surface of the light shielding plate 172. The frame 187 may adhere to the upper surface of the light shielding plate 172 and may extend toward the display panel 100, for example, in the X-axis direction. Hence, the frame 187 may be separated from the display panel 100 and may shield the upper surface of the display panel 100.

The display device 10 according to the embodiment of the invention may shield the upper surface of the light shielding plate 172 and the upper surface of the display panel 100 using the sealing member 183 or the frame 187. Hence, the upper surface of the light shielding plate 172 and the upper surface of the display panel 100 may be protected.

Figure 7:
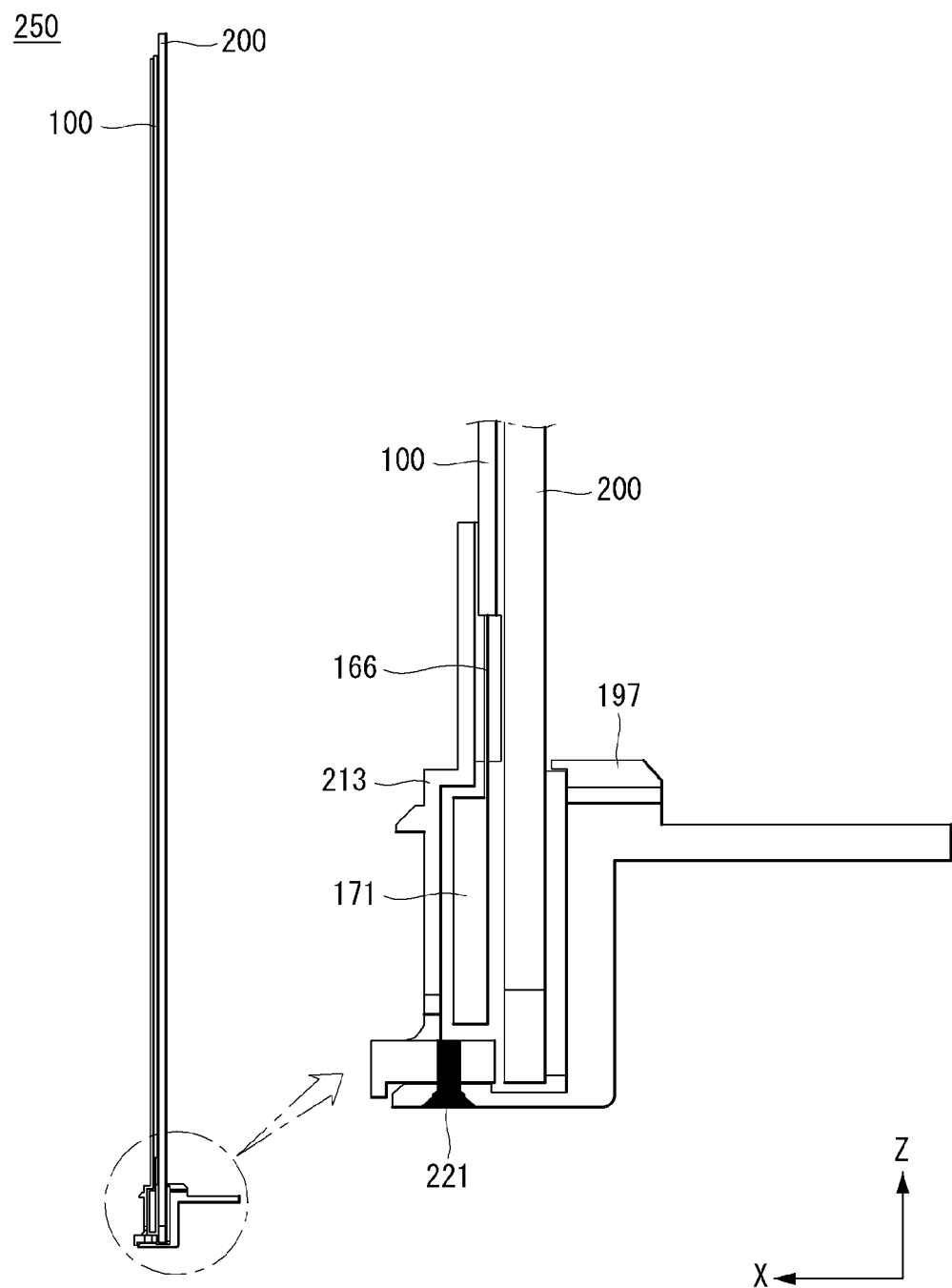

Referring to FIG. 7, the lower part of the display unit 250 may be coupled with a link bar 197 and a front deco 213.

The front deco 213 may shield a source PCB 171 and a source chip-on film (COF) 166 connected to the display panel 100 from the outside.

Signal lines for transmitting digital video data and timing control signals received from the timing controller board 121 may be positioned on the source PCB 171. The source PCB 171 may be connected to the display panel 100 through the source COF 166.

The source COF 166 may be electrically connected to the source PCB 171 and data pads of the display panel 100. A data integrated circuit (IC) may be mounted on the source COF 166.

The front deco 213 may be attached to the back cover 200 through a double-sided tape. A portion of the front deco 213, in which the source PCB 171 is positioned, may forwardly protrude more than other portion of the front deco 213. The front deco 213 may have at least one cable hole, through which the FFCs connecting the source PCB 171 to the timing controller board 121 can pass, at the front of the front deco 213.

The front deco 213 may be positioned at the front surface of the display unit 250 and may prevent the display unit 250 from forwardly bending due to an external force.

The link bar 197 may be coupled with the display unit 250 and the housing 300 and may fix the display unit 250 to the housing 300. A lower surface of the display unit 250 and a lower surface of the front deco 213 may be mounted on a first extension portion 197a (refer to FIG. 8) of the link bar 197. More specifically, the first extension portion 197a of the link bar 197 may extend to the lower surface of the display unit 250 and may be coupled with the front deco 213. A body portion 197b (refer to FIG. 8) of the link bar 197 may be attached to the back cover 200. A second extension portion 197c (refer to FIG. 8) of the link bar 197 may extend in the opposite direction of the first extension portion 197a and may be coupled with the housing 300.

The link bar 197 can fix the display unit 250 to the housing 300 without another panel cover fastened to a screw 221.

FIGS. 8 to 20 illustrate the display device according to the embodiment of the invention.

Figure 8:
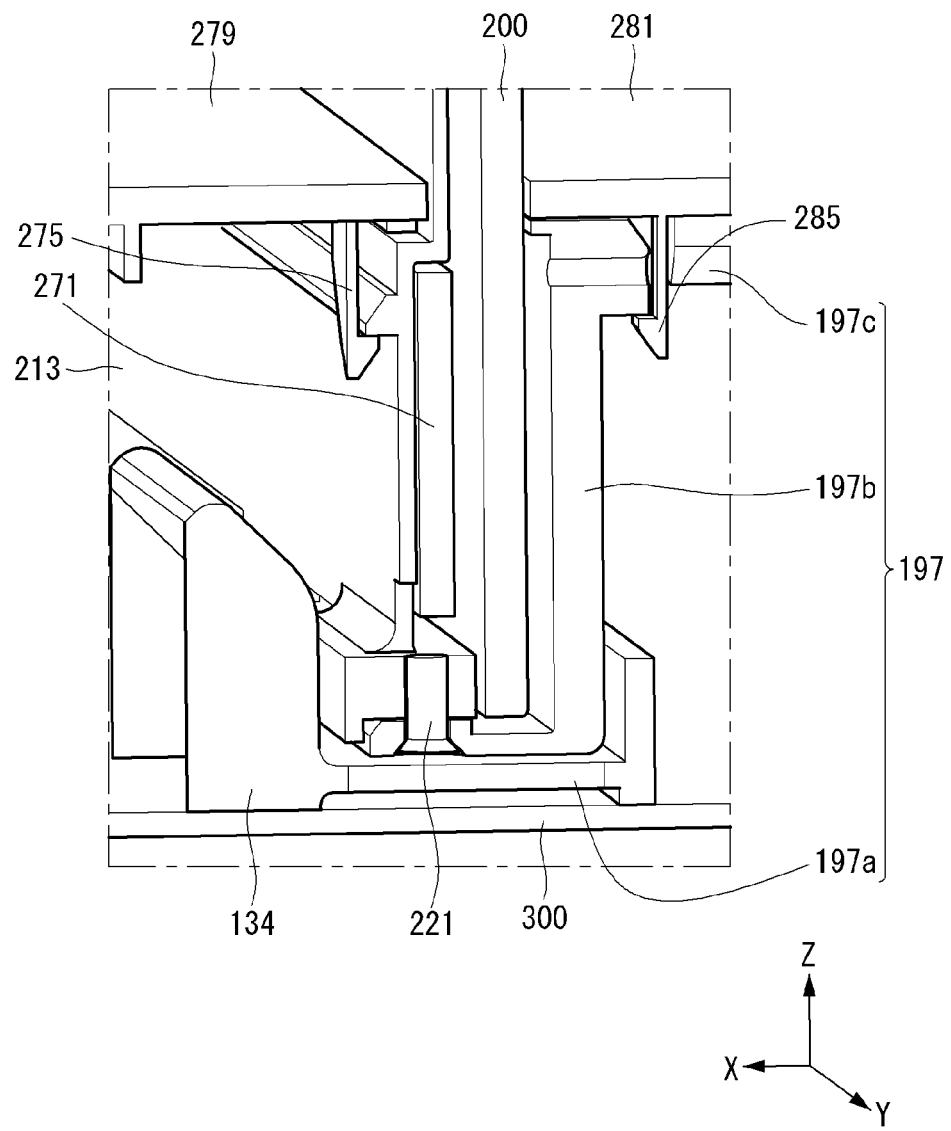
FIGS. 8 to 20 illustrate a display device according to an example embodiment of the invention.

Referring to FIG. 8, the display device 10 according to the embodiment of the invention may include a tension bracket 134 positioned in a portion where the housing 300 and other component contact each other. The tension bracket 134 may be positioned in a portion, into which the display unit 250 is inserted. Namely, the tension bracket 134 may be positioned in a portion where the first extension portion 197a of the link bar 197 and the housing 300 contact each other.

The tension bracket 134 may prevent the back cover 200 from being damaged by an impact generated when the display unit 250 is coupled with the housing 300. Also, the tension bracket 134 may prevent the back cover 200 from being damaged by an impact generated when the display device vibrates. Hence, the tension bracket 134 may include a material having high elasticity capable of bearing the weight of the display unit 250. For example, the tension bracket 134 may be formed of plastic material. A shape of the tension bracket 134 is described in detail later.

A front cover 279 and a rear cover 281 may be coupled with a front upper portion and a back upper portion of the housing 300, into which the display unit 250 is inserted. The front cover 279 may be coupled with the front upper portion of the housing 300 by hanging a front hook 275 to a front protrusion of the front deco 213. The rear cover 281 may be coupled with the back upper portion of the housing 300 by hanging a rear hook 285 to the second extension portion 197c of the link bar 197. The front cover 279 and the rear cover 281 may entirely cover an inner portion of the housing 300 except a portion, into which the display unit 250 is inserted.

Figure 9:
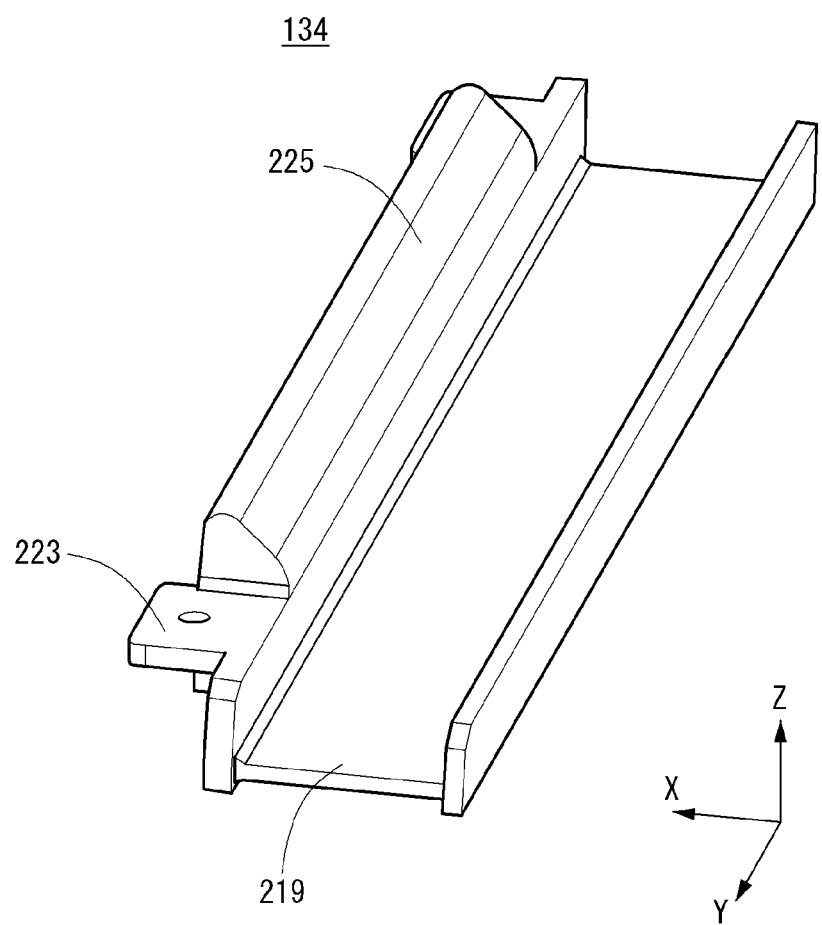

Referring to FIG. 9, the tension bracket 134 may include a fastening portion 223, a guide portion 225, and a receiving portion 219.

Both sides of the tension bracket 134 may upwardly protrude in the thickness direction (for example, the X-axis direction), and the receiving portion 219 may be positioned in a concave middle portion of the tension bracket 134. The receiving portion 219 may be a portion, into which the display unit 250 is inserted. After the display unit 250 is inserted into the receiving portion 219, the receiving portion 219 may not deviate from its location by protrusions positioned on both sides of the tension bracket 134.

The receiving portion 219 may extend in the longitudinal direction (for example, the Y-axis direction), so that it can receive the display unit 250. Because the plurality of tension brackets 134 may receive the display unit 250, a width of each receiving portion 219 in the longitudinal direction may be less than a width of the display unit 250 in the longitudinal direction.

The guide portion 225 may be positioned on at least one of both protruding sides of the receiving portion 219. The guide portion 225 may have a shape, in which one surface of the guide portion 225 is inclined to the receiving portion 219. Hence, even if the display unit 250 does not accurately proceed toward the receiving portion 219, the guide portion 225 can guide the display unit 250 so that the display unit 250 proceeds toward the receiving portion 219. The guide portion 225 may extend in the longitudinal direction, so as to easily guide the display unit 250. Because the plurality of tension brackets 134 may receive the display unit 250, a width of each guide portion 225 in the longitudinal direction may be less than the width of the display unit 250 in the longitudinal direction.

Curvature of an upper surface of the guide portion 225 may successively vary. Namely, the upper surface of the guide portion 225 may be round in shape. Because the upper surface of the guide portion 225 is round, the guide portion 225 can guide the display unit 250 so that the display unit 250 more easily proceeds toward the receiving portion 219.

The fastening portion 223 may be positioned on both sides of the guide portion 225 in the longitudinal direction. The fastening portion 223 may fasten the tension bracket 134 to the housing 300 through a screw. The fastening portion 223 may fix the tension bracket 134 and may operate so that the display unit 250 does not deviate from the housing 300.

Figure 10:
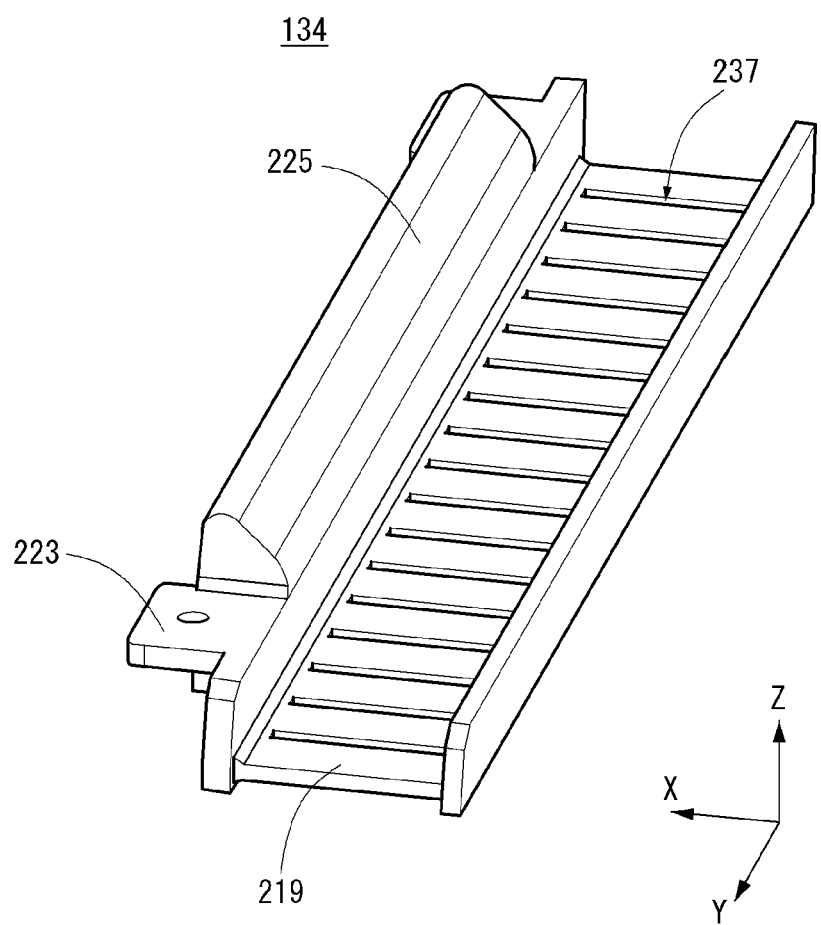

Referring to FIG. 10, the receiving portion 219 of the tension bracket 134 may include a plurality of grooves 237, which are separated from one another by a predetermined distance and extend in the thickness direction (for example, the X-axis direction). The receiving portion 219 may easily elastically move up and down due to the plurality of grooves 237. Hence, an impact of the display unit 250 the receiving portion 219 absorbs may increase.

FIG. 10 shows that each groove 237 has a shape extending straightly in the thickness direction, as an example. Other shapes may be used. For example, the groove 237 may have curvature and extend. As the number of grooves 237 increases, the impact of the display unit 250 the receiving portion 219 absorbs may increase.

Figure 11:
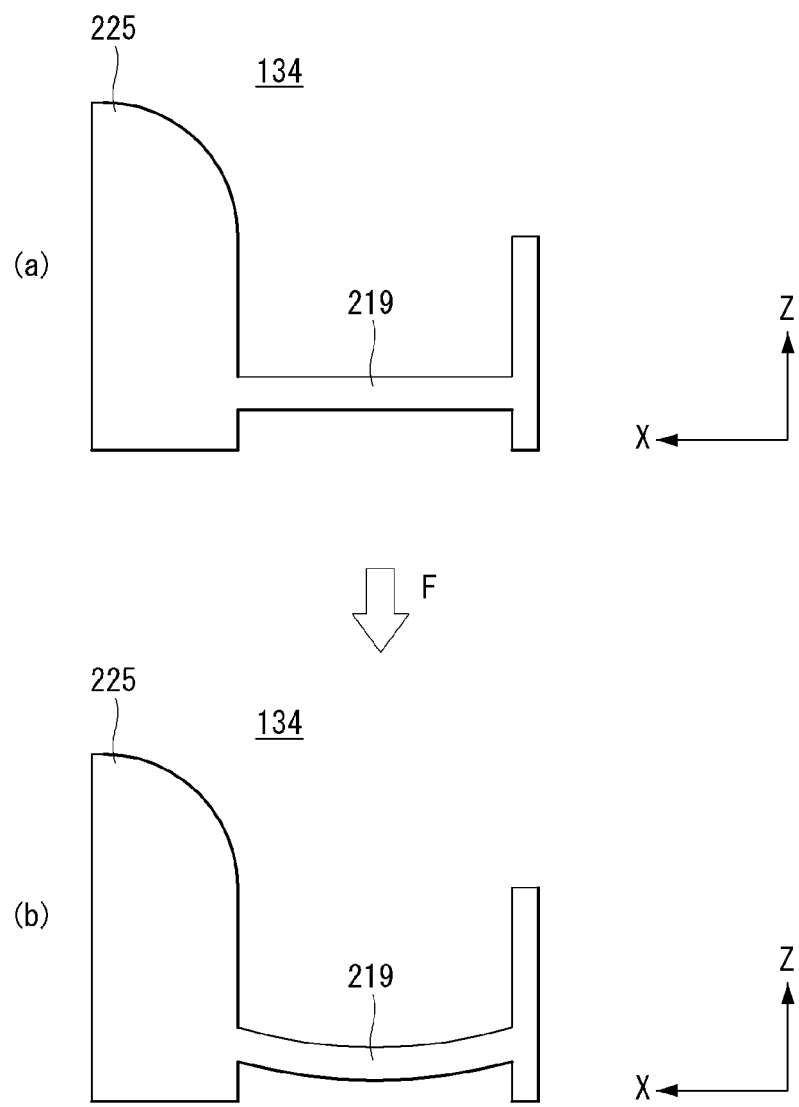

Referring to FIG. 11, the receiving portion 219 of the tension bracket 134 may not contact the bottom by two protrusions on both sides of the tension bracket 134. Namely, the receiving portion 219 may be separated from the ground.

When an external force F is applied to the tension bracket 134, the receiving portion 219 of the tension bracket 134 may bend to the ground. The receiving portion 219 may absorb an impact of the display unit 250 while bending to the ground. After the external force F is applied to the tension bracket 134, the receiving portion 219 may return to an original position due to the elasticity.

In the display device 10 according to the embodiment of the invention, the receiving portion 219 of the tension bracket 134 can absorb the impact of the display unit 250 while bending to the ground. Hence, durability of the back cover 200 of the display unit 250 can be further improved.

Figure 12:
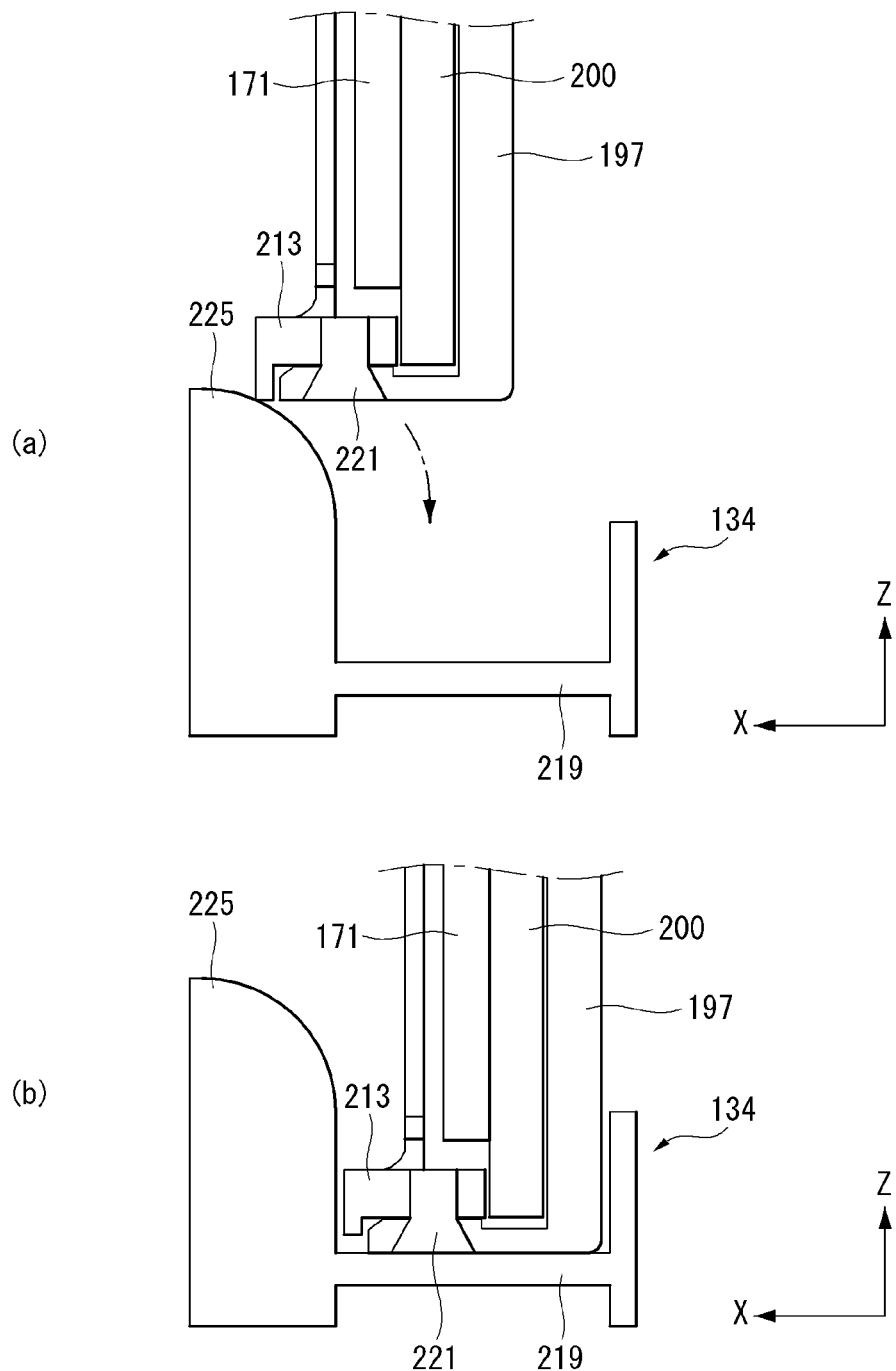

Referring to FIG. 12, the guide portion 225 of the tension bracket 134 may perform a guide operation, so that a lower portion of the display unit 250 proceeds toward the receiving portion 219. The lower portion of the display unit 250 including the back cover 200 may contact the guide portion 225. More specifically, a front lower portion of the front deco 213 may contact the guide portion 225. In this instance, because one surface of the guide portion 225 is inclined to the receiving portion 219, the lower portion of the display unit 250 may slide along the inclined surface of the guide portion 225.

One surface of the guide portion 225 may have curvature, so that the guide portion 225 can more easily slide toward the receiving portion 219. Further, the guide portion 225 may have the smooth surface, so that the guide portion 225 can more easily slide toward the receiving portion 219. In the two protrusions on both sides of the tension bracket 134, an area of one protrusion, on which the guide portion 225 is positioned, may be larger than an area of the other protrusion. Hence, even if the lower portion of the display unit 250 proceeds toward the receiving portion 219 at a considerable distance therebetween and is inserted into the receiving portion 219, the guide portion 225 can guide the display unit 250 to the receiving portion 219.

In the display device 10 according to the embodiment of the invention, the guide portion 225 can guide the lower portion of the display unit 250 to the receiving portion 219. Hence, the user can easily assembly the display device 10.

Figure 13:
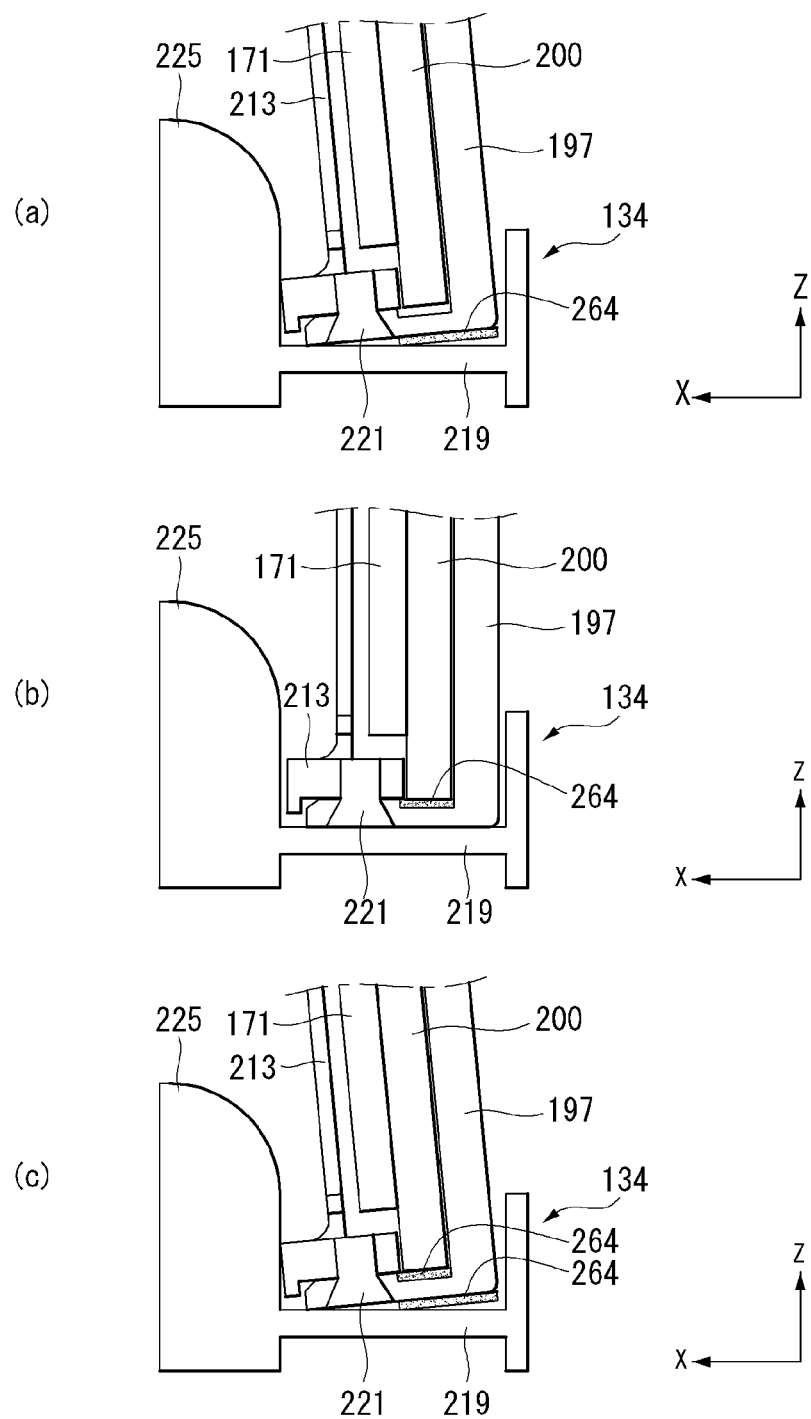

Referring to FIG. 13, a cushion 264 may be positioned between the tension bracket 134 and the lower portion of the display unit 250. The cushion 264 may help in absorbing an impact of the back cover 200. Hence, the cushion 264 may prevent or reduce a damage of the back cover 200 resulting from the impact, compared to when only the tension bracket 134 exists.

The cushion 264 may include a material with high elasticity. For example, the cushion 264 may include sponge or cotton.

For example, as shown in (a) of FIG. 13, the cushion 264 may be positioned between the tension bracket 134 and the link bar 197. The cushion 264 may absorb an impact applied to the link bar 197 and entirely prevent a damage of the display unit 250.

As another example, as shown in (b) of FIG. 13, the cushion 264 may be positioned between the link bar 197 and the back cover 200. The cushion 264 may absorb an impact applied to the back cover 200 and prevent a damage of the back cover 200. In this instance, although the cushion 264 does not absorb an entire impact of the display unit 250, the cushion 264 may more efficiently absorb the impact of the back cover 200.

As another example, as shown in (c) of FIG. 13, the cushion 264 may be positioned between the tension bracket 134 and the link bar 197 and between the link bar 197 and the back cover 200. Hence, the cushion 264 may absorb the entire impact of the display unit 250 and also prevent the damage of the back cover 200. The cushion 264 may be thin enough not to disturb the display unit 250 and/or the back cover 200 in the assembling process.

In the display device 10 according to the embodiment of the invention, the cushion 264 can absorb the impact of the display unit 250. Hence, the damage of the display unit 250 can be prevented or reduced.

Figure 14:
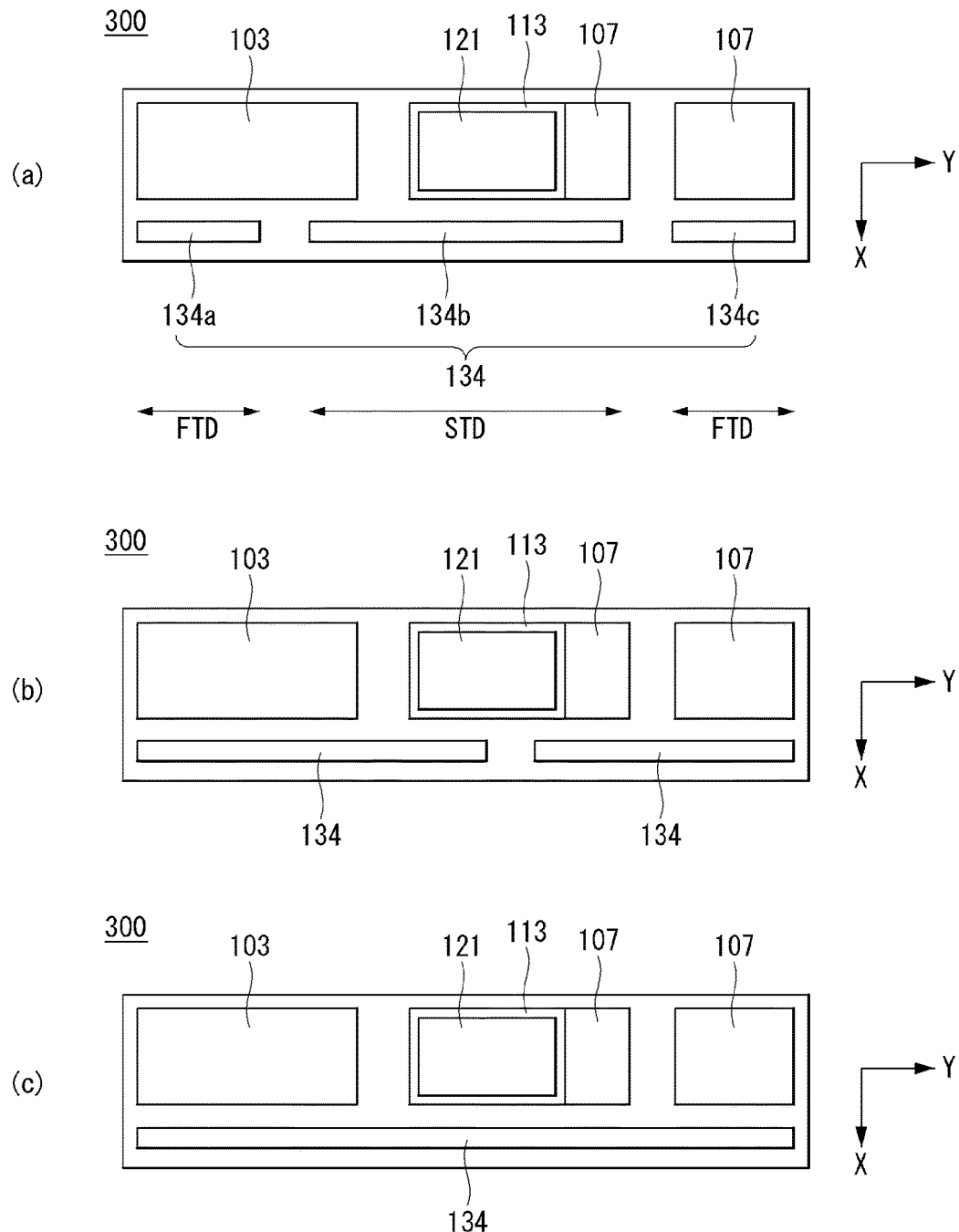

Referring to FIG. 14, the tension bracket 134 may be coupled with the housing 300 in various shapes. For example, the tension bracket 134 may be positioned at the front surface of each PCB. The tension brackets 134 may be respectively positioned at the front surfaces of the main board 103, the timing controller board 121, and the power supply board 107. Hence, the electrical connection between each PCB and the display unit 250 may be easily performed through wire electrodes.

For example, the tension bracket 134 may be positioned based on the middle of the housing 300 and may be separated from each other. Namely, one tension bracket 134 may be positioned on one side of the housing 300 in the longitudinal direction (for example, the Y-axis direction), and another tension bracket 134 may be positioned on the other side of the housing 300 in the longitudinal direction (for example, the Y-axis direction). In this instance, the tension brackets 134 may dividedly absorb the impact of the both sides of the display unit 250. Hence, the tension brackets 134 may absorb more the impact than when the impact is applied to only one side of the display unit 250.

The tension bracket 134 may be in plural. Namely, the tension bracket 134 may include first to third tension brackets 134a, 134b, and 134c. The second tension bracket 134b positioned in the middle of the plurality of tension brackets may be longer than the first and third tension brackets 134a and 134c. A length STD of the second tension bracket 134b may be longer than lengths FTD of the first and third tension brackets 134a and 134c. Namely, a width STD of the second tension bracket 134b in the longitudinal direction (for example, the Y-axis direction) of the housing 300 may be greater than widths FTD of the first and third tension brackets 134a and 134c in the longitudinal direction (for example, the Y-axis direction) of the housing 300.

Hence, the middle portion bearing a maximum load of the display unit 250 can absorb more the impact than other portion. Other structures may be used. For example, a length of the tension bracket 134 positioned in the middle of the housing 300 may be shorter than a length of the tension bracket 134 positioned in other portion.

As another example, one tension bracket 134 may be coupled with the housing 300. Because one tension bracket 134 is coupled with the housing 300, the manufacturing cost may be reduced, and the manufacturing process may be simplified.

Figure 15:
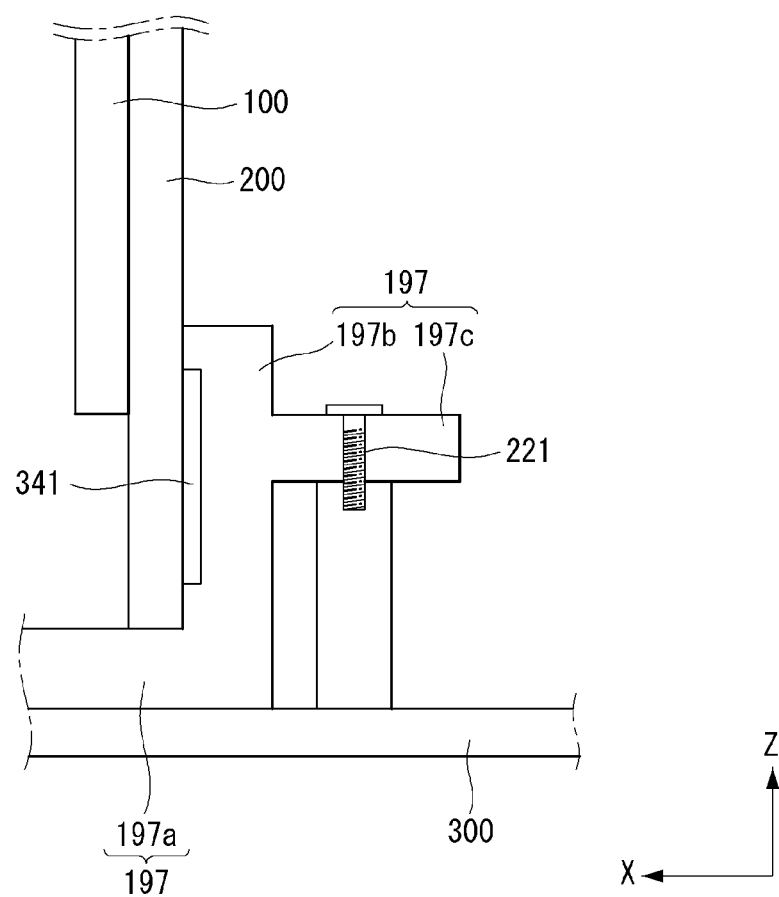

Referring to FIG. 15, the display device 10 according to the embodiment of the invention may couple the second extension portion 197c of the link bar 197 with the housing 300 through at least one screw 221. Because the second extension portion 197c of the link bar 197 extends in the thickness direction (for example, the X-axis direction) of the housing 300, the second extension portion 197c may be coupled with the housing 300 through at least one screw 221 extending in the vertical direction.

The body portion 197b of the link bar 197 may be attached to the back cover 200. The body portion 197b may be coupled with the back cover 200 through an adhesive layer 341. Because the side of the back cover 200 is coupled with the body portion 197b, the adhesive layer 341 may include a material having a very excellent adhesive strength. Configuration and shape of the adhesive layer 341 are described later.

Because the back cover 200 includes the transparent material, for example, glass, the back cover 200 cannot be coupled with the link bar 197 using the screw. Hence, the back cover 200 may be coupled with the link bar 197 using the adhesive layer 341.

The display device 10 according to the embodiment of the invention may couple the back cover 200 with the housing 300 using not another cover but the link bar 197 including the adhesive layer 341. Hence, the manufacturing cost may be reduced, and the completely transparent display device 10 may be implemented because another cover is not used.

Figure 16:
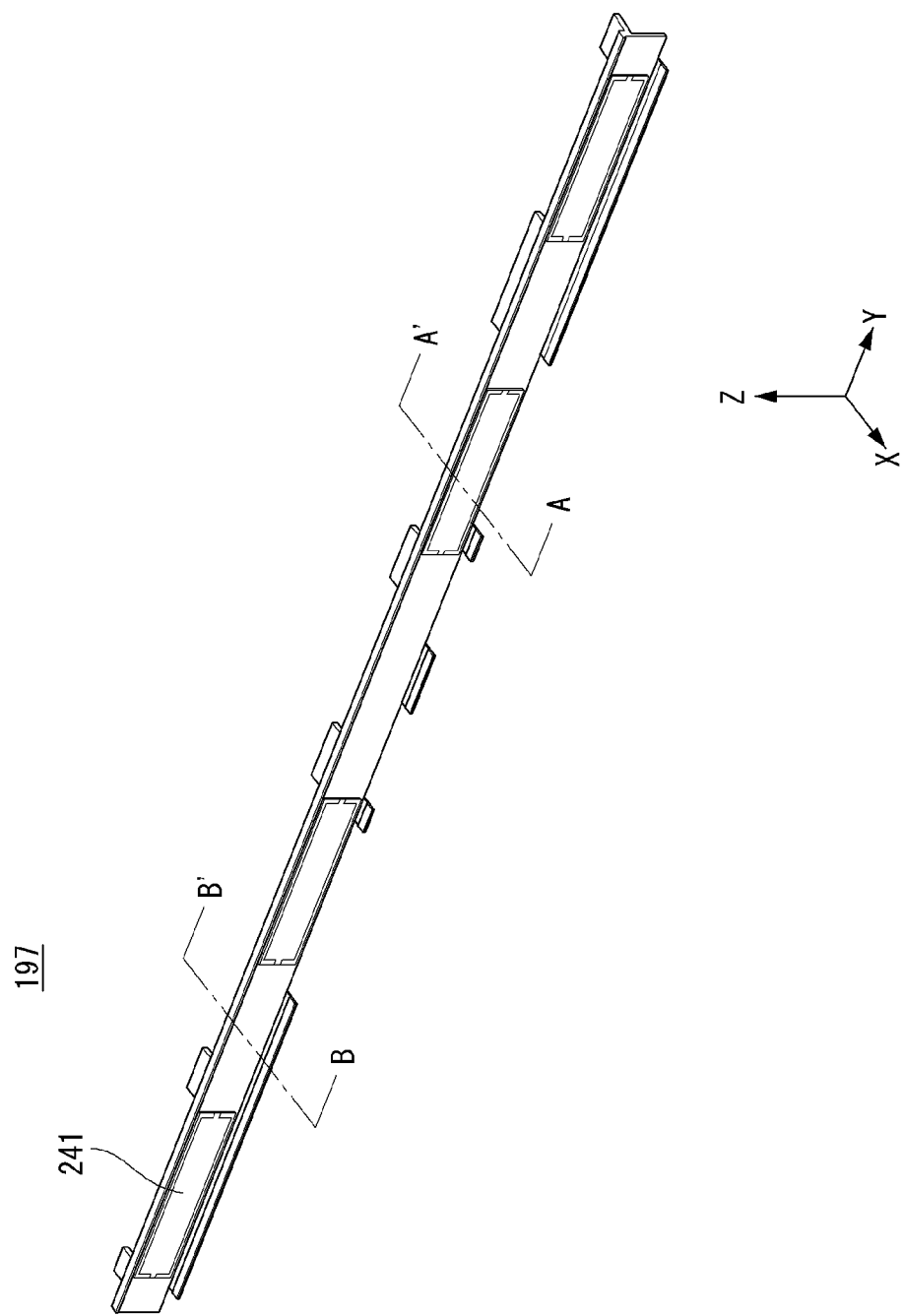
Figure 17:
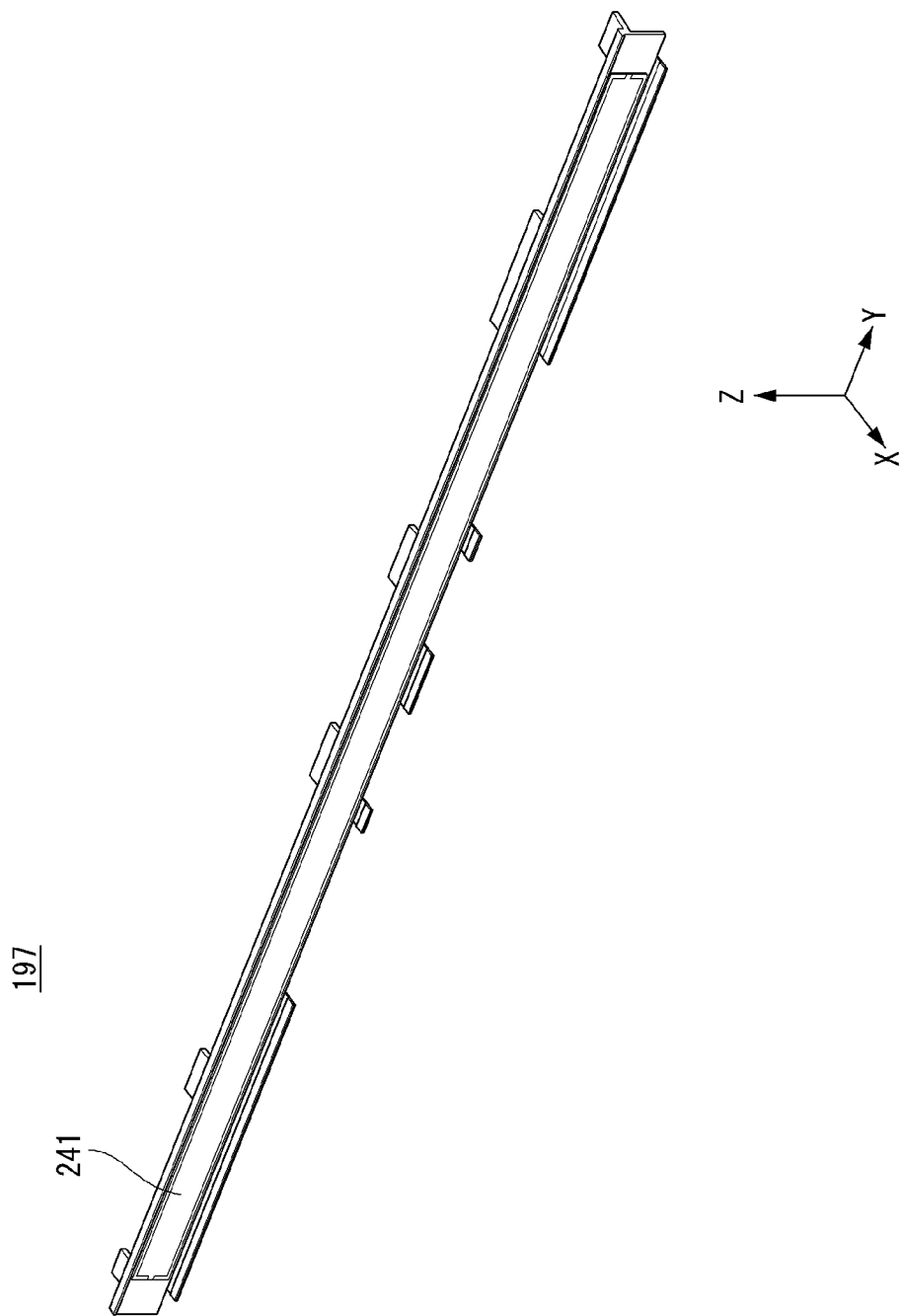

Referring to FIGS. 16 and 17, the link bar 197 of the display device 10 according to the embodiment of the invention may have at least one opening. A fixer 241 may be mounted in the opening.

The link bar 197 may be formed by extruding aluminum. The link bar 197 may backwardly extend and may be connected to the housing 300. Further, the link bar 197 may forwardly extend and may be connected to the front deco 213. The link bar 197 may be entirely inserted into the housing 300.

For example, as shown in FIG. 16, the plurality of fixers 241 may be separated from one another in the opening of the link bar 197. The fixer 241 may include transparent plastic material. More specifically, the fixer 241 may include transparent material, so as to perform ultraviolet (UV) curing on an adhesive layer, which will be attached to the front surface.

As another example, as shown in FIG. 17, the fixer 241 may be configured as one body for the stronger adhesion. In this instance, the link bar 197 may be more strongly attached to the back cover 200. A method for coupling the fixer 241 with the link bar 197 is described later.

Figure 18:
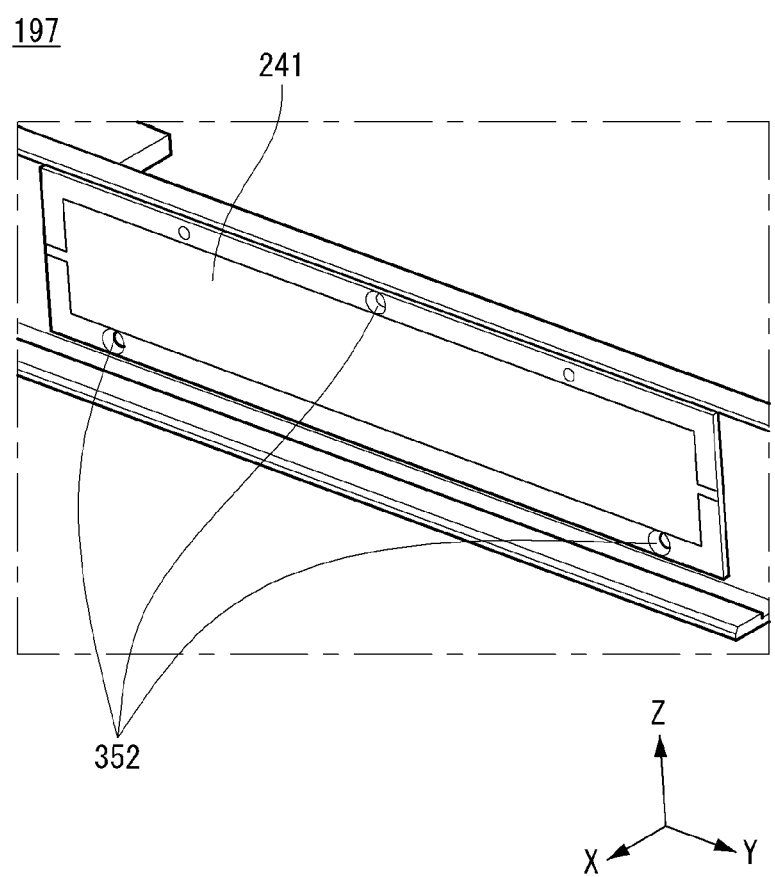

Referring to FIG. 18, the fixer 241 may be coupled with the link bar 197 through a plurality of holes 352 positioned at an edge of the fixer 241. More specifically, the fixer 241 may be fastened to the link bar 197 by inserting screws into the plurality of holes 352.

A front surface of the fixer 241 may not protrude more than a front surface of the link bar 197, and the fixer 241 and the link bar 197 may be positioned in a straight line. Hence, the fixer 241 and the link bar 197 may simultaneously contact the back cover 200.

Because the edge of the fixer 241, at which the plurality of holes 352 are positioned, overlaps the link bar 197 and is coupled with the link bar 197, the edge of the fixer 241 may not transmit light. Hence, a middle portion of the fixer 241 except the edge of the fixer 241 may be an area transmitting light for the UV irradiation.

FIG. 18 shows that one hole 352 is positioned in the middle of an upper part of the fixer 241, and the two holes 352 are respectively positioned on both sides of a lower part of the fixer 241, as an example. Other configurations may be used. For example, the plurality of holes 352 may be positioned at the edge of the fixer 241 in various manners.

Figure 19:
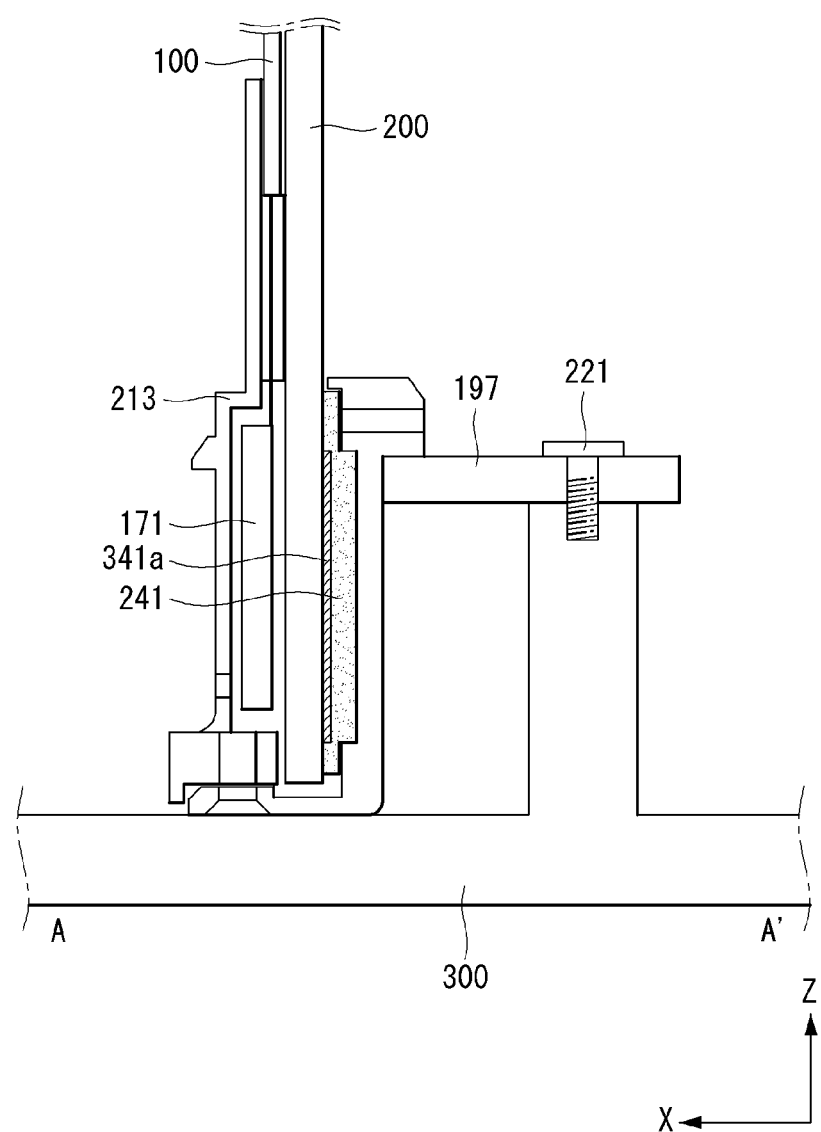

FIG. 19 is a cross-sectional view taken along line A-A' of FIG. 16.

Referring to FIG. 19, the back cover 200 and the link bar 197 may be attached to each other through a first adhesive layer 341a in the opening of the link bar 197, in which the fixer 241 is positioned. The first adhesive layer 341a may be positioned at a front surface of the opening of the link bar 197, in which the fixer 241 is positioned.

When the back cover 200 is pressed on a portion of the link bar 197, to which the first adhesive layer 341a is applied, the first adhesive layer 341a may be widely spread and may attach the back cover 200 to the link bar 197.

The first adhesive layer 341a may UV resin. An UV beam may be irradiated onto the first adhesive layer 341a through the transparent fixer 241, and thus the first adhesive layer 341a may be UV-cured. Hence, a curing time when the UV irradiation is used may be shorter than a curing time when another curing method is used. Further, the UV curing may be more economical than thermal curing.

Figure 20:
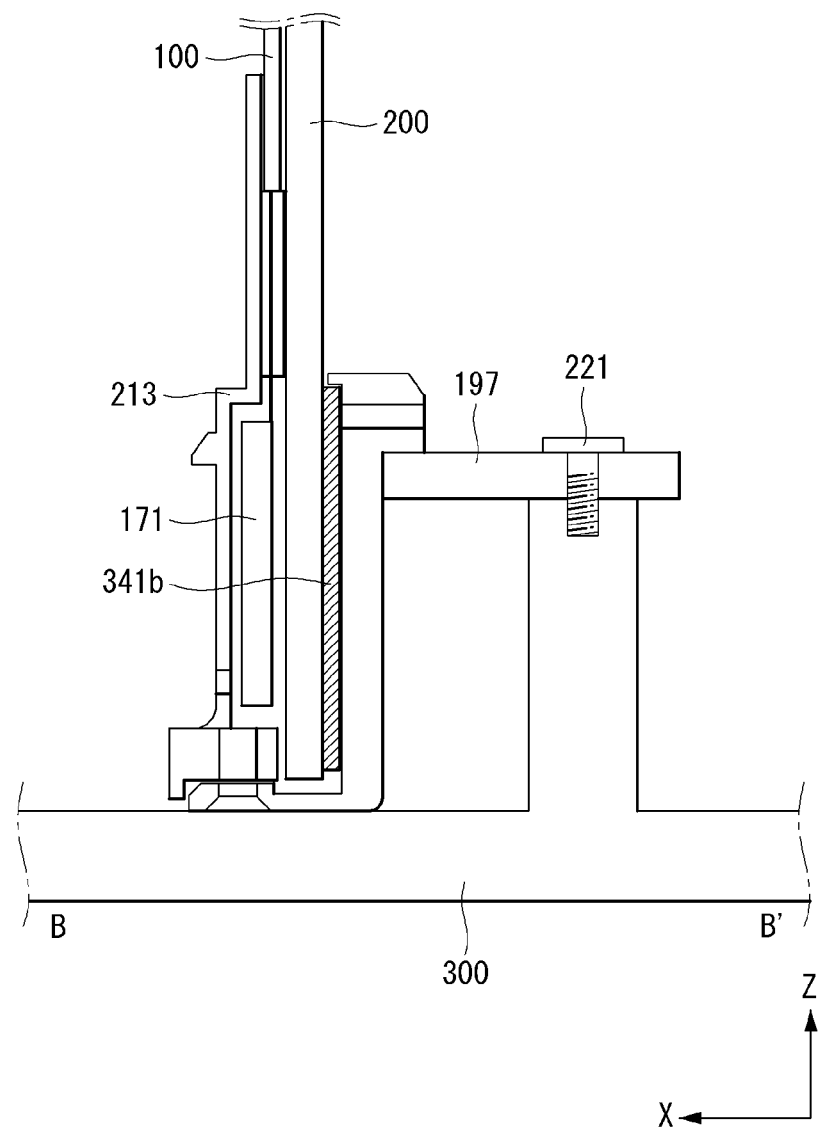

FIG. 20 is a cross-sectional view taken along line B-B' of FIG. 16.

Referring to FIG. 20, the back cover 200 and the link bar 197 may be attached to each other through a second adhesive layer 341b in an area, in which the link bar 197 is positioned. The second adhesive layer 341b may be positioned at a front surface of an area of the link bar 197, in which the fixer 241 is not positioned. Hence, the second adhesive layer 341b may be positioned in a portion of the link bar 197, in which the first adhesive layer 341a is not positioned. The first adhesive layer 341a and the second adhesive layer 341b may make up for each other's insufficient adhesive strength.

The second adhesive layer 341b may include a double-sided tape. Because the second adhesive layer 341b is attached using the double-sided tape, an adhesive strength of the second adhesive layer 341b may be less than an adhesive strength of the first adhesive layer 341a. A thickness of the second adhesive layer 341b may be substantially equal to a thickness of the first adhesive layer 341a, so that the second adhesive layer 341b is attached to the back cover 200 at the same time as the first adhesive layer 341a.

The second adhesive layer 341b may help in attaching a link bar 197, on which the UV irradiation cannot be performed, to the back cover 200. Hence, the link bar 197 and the back cover 200 can be strongly coupled.

FIGS. 21 to 31 illustrate a method for coupling components of the display device according to the embodiment of the invention.

Figure 21:
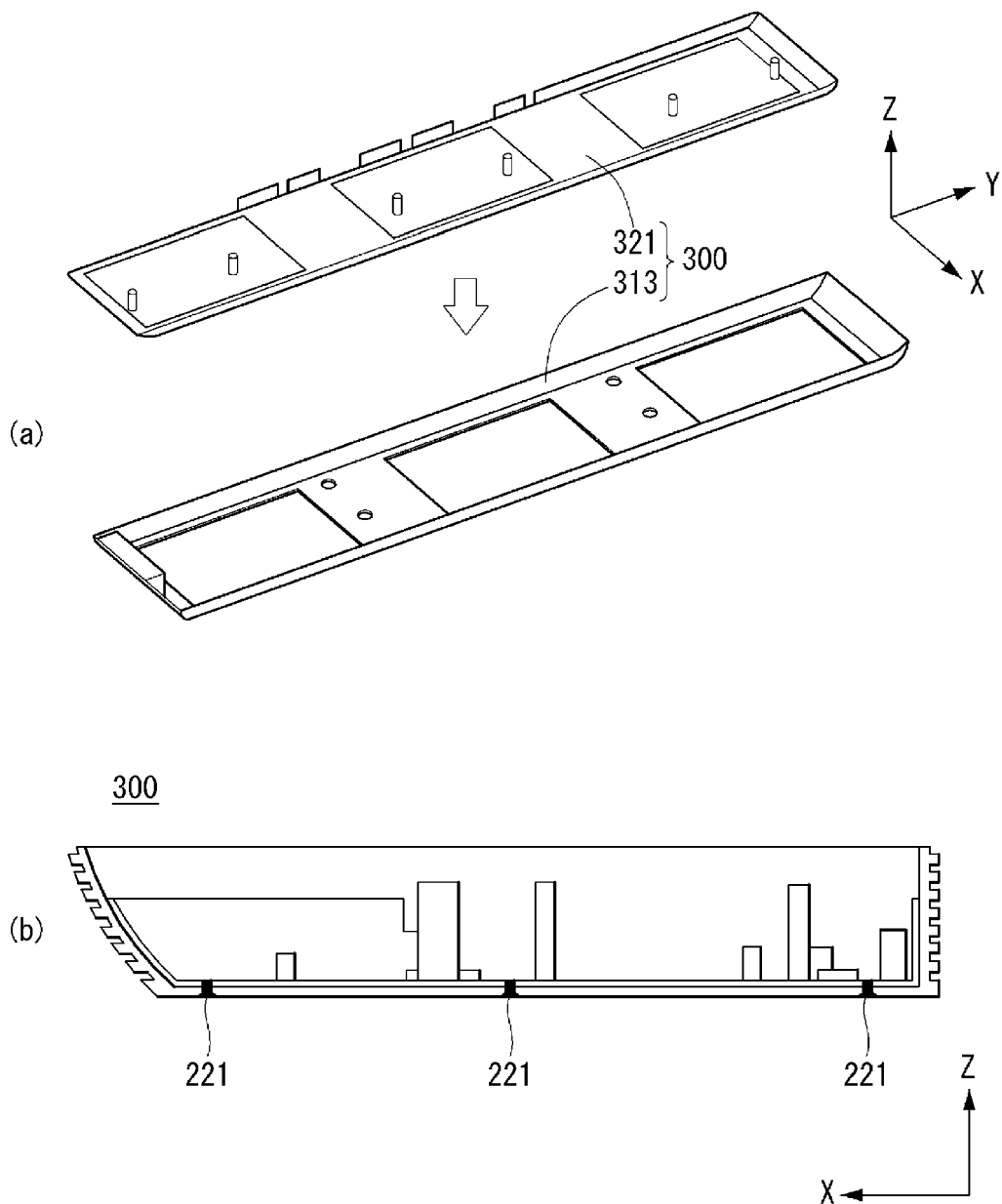
FIGS. 21 to 31 illustrate a method for coupling components of a display device according to an example embodiment of the invention.

As shown in FIG. 21, the housing 300 may include a metal housing 321 and a mold housing 313. The housing 300 may be formed by coupling the metal housing 321 on the mold housing 313. The mold housing 313 may be fastened to the metal housing 321 through at least one screw 221.

A front surface of the mold housing 313 may have curvature. Hence, the user may feel an improvement of the appearance of the display device. The mold housing 313 may have a plurality of recesses. The plurality of recesses may be separated from one another and may be a location to mount at least one PCB. The location to mount at least one PCB may contact not the ground of the mold housing 313 but the ground of the metal housing 321. Hence, a portion, in which at least one PCB is positioned, may be grounded.

The metal housing 321 may have a flat shape. The metal housing 321 may receive electromagnetic waves emitted from at least one PCB. Hence, the metal housing 321 may be formed of a conductive material and may function to block the electromagnetic waves.

The embodiment of the invention illustrates that the housing 300 includes the metal housing 321 and the mold housing 313, as an example. Other configurations may be used. For example, the housing 300 may be configured as one body formed of a conductive material and may block the electromagnetic waves.

In the display device 10 according to the embodiment of the invention, the housing 300 may be configured to include the metal housing 321 and the mold housing 313. Hence, both the improvement of the appearance of the display device 10 and the interception of the electromagnetic waves can be achieved.

Figure 22:
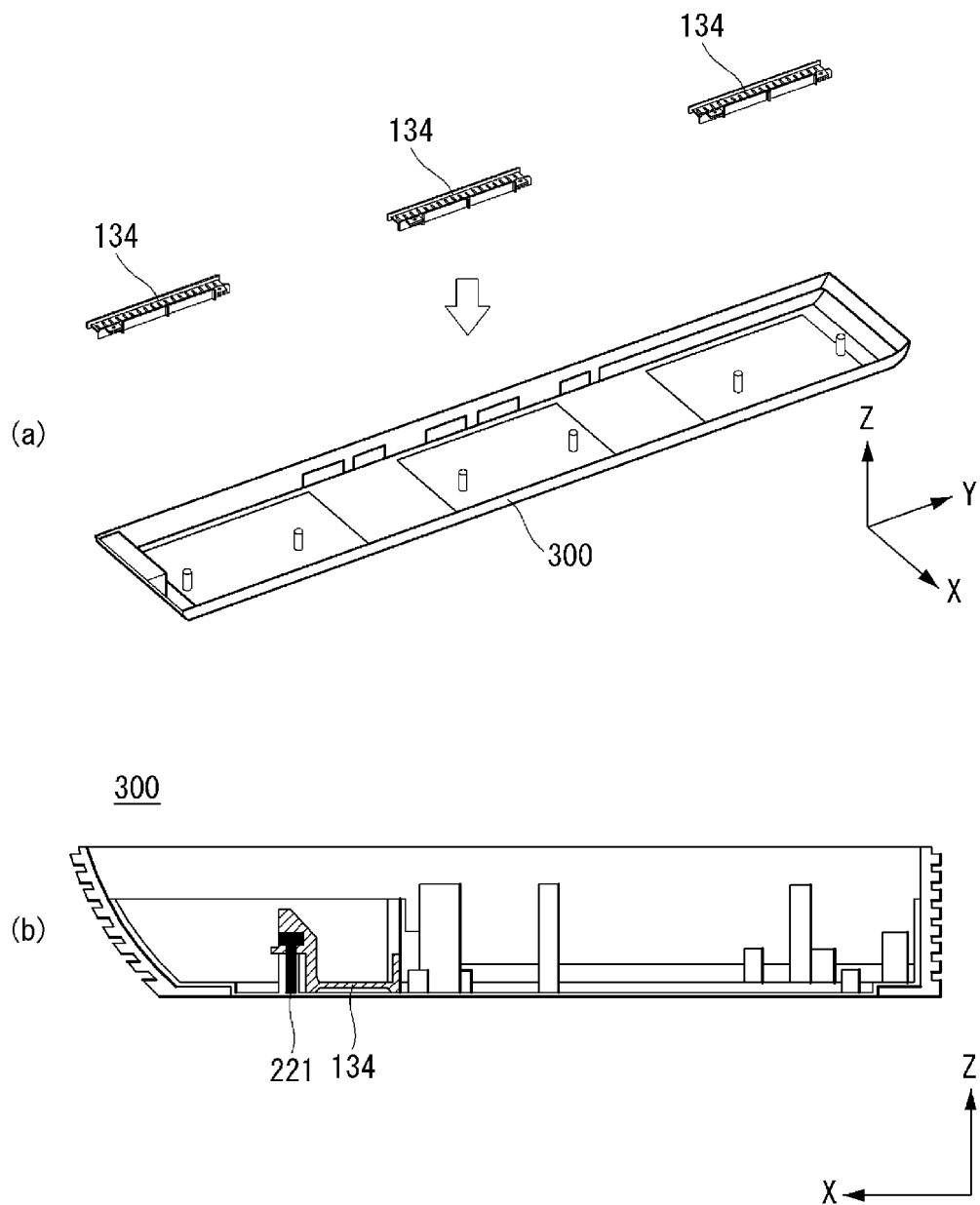

Next, as shown in FIG. 22, the tension bracket 134 may be fastened to the housing 300. The tension bracket 134 may be in plural. The plurality of tension brackets 134 may be separated from one another and may be fastened to the housing 300.

The tension bracket 134 may be fastened to the housing 300 through at least one screw 221. The tension bracket 134 may be fastened to a location to mount the display unit 250. The embodiment of the invention illustrates that the three tension brackets 134 are coupled with the housing 300, as an example. Other configurations may be used. For example, the tension bracket 134 may be coupled with the housing 300 in various manners, as shown in FIG. 14.

Figure 23:
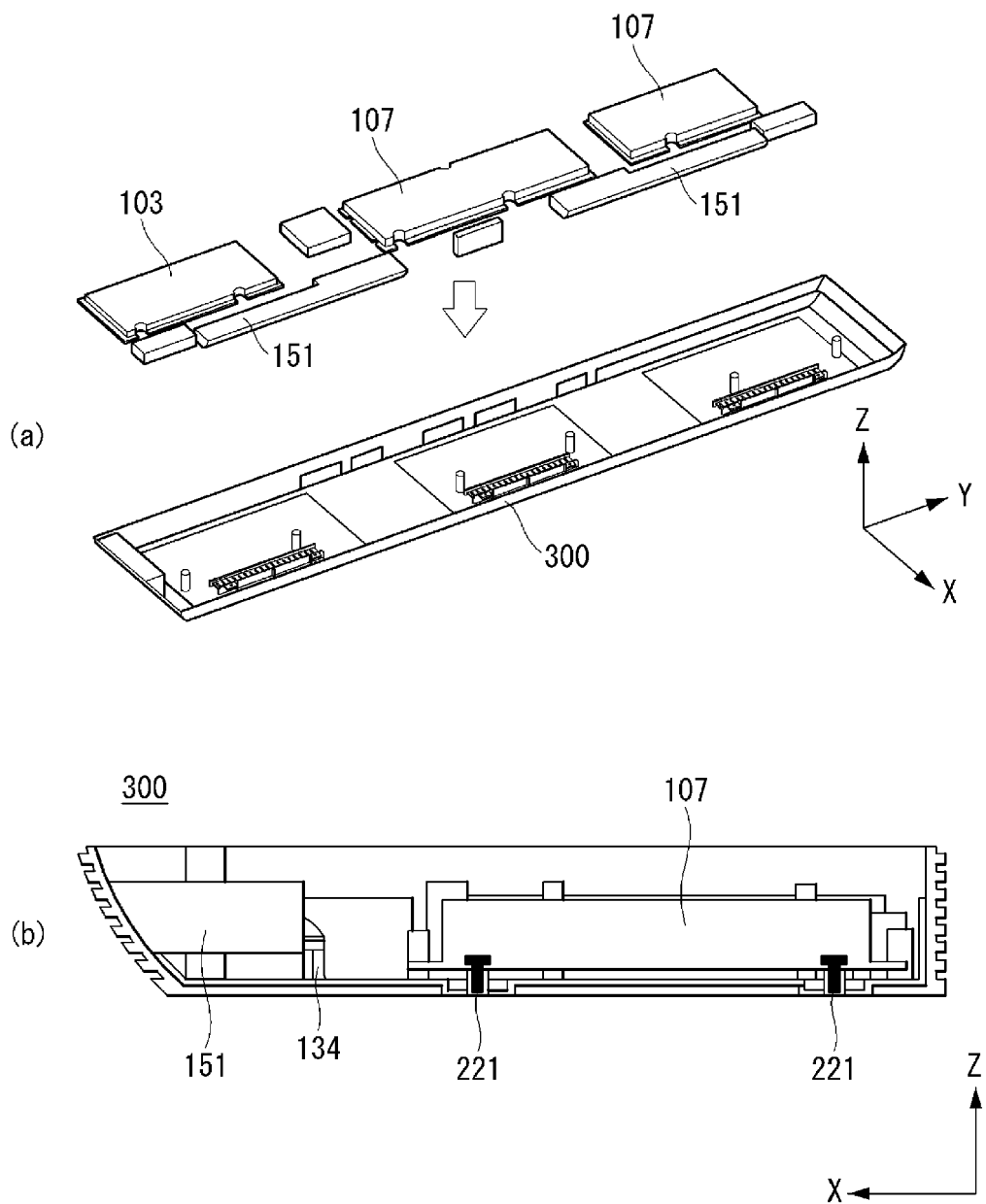

Next, as shown in FIG. 23, at least one PCB and other electronic device may be coupled with the housing 300. For example, the main board 103, the power supply board 107, and a fan may be coupled with a back portion of the housing 300, and a speaker 151 may be coupled with a front portion of the housing 300.

Because at least one PCB occupies a large space of the housing 300, at least one PCB may be positioned at the back portion of the housing 300, which makes it difficult for the user to recognize. Because the speaker 151 has to provide the sound for the user, the speaker 151 may be positioned at the front portion of the housing 300. At least one PCB and the speaker 151 may be coupled with the housing 300 using at least one screw 221.

Figure 24:
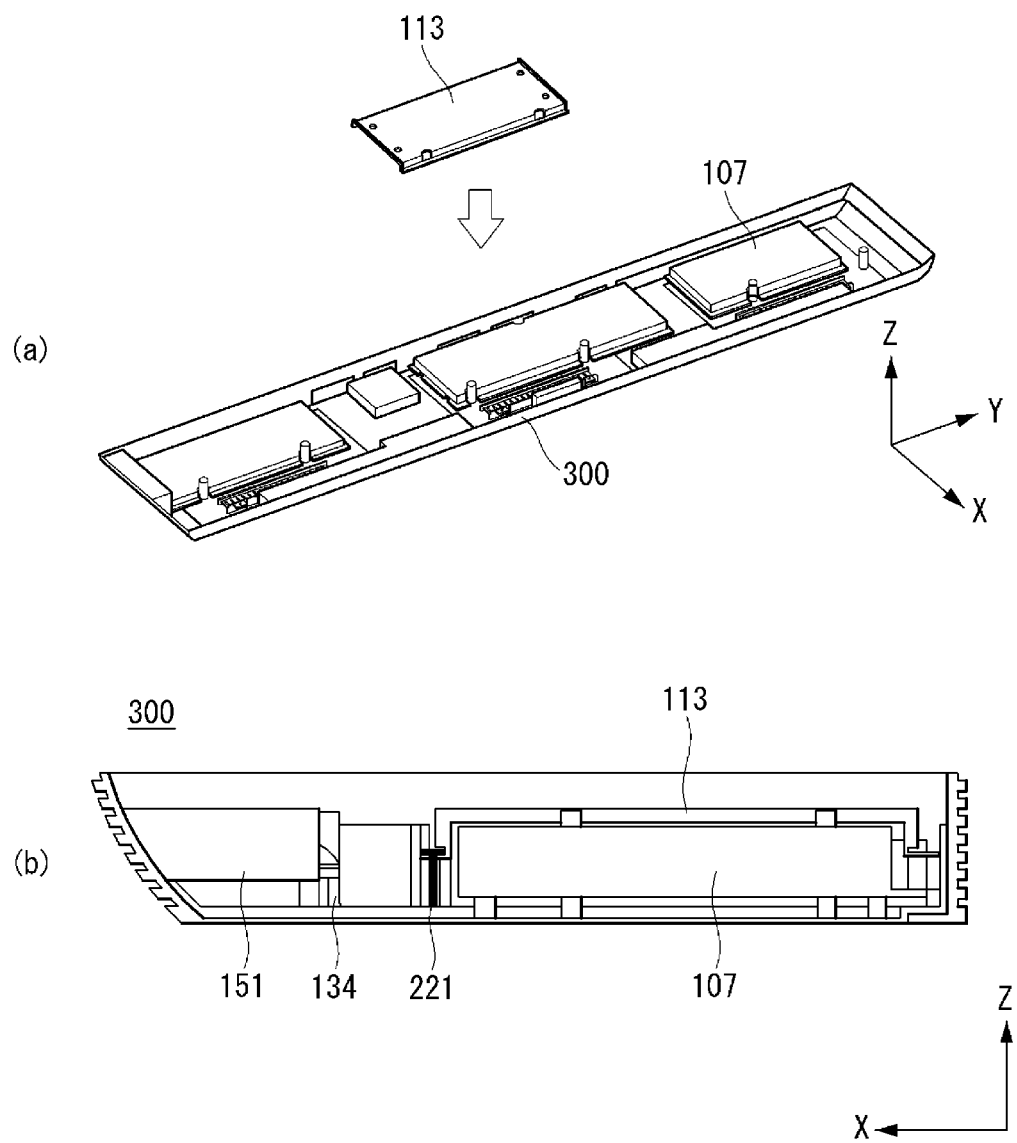

Next, as shown in FIG. 24, the timing controller shield 113 may be positioned on the power supply board 107 coupled with the housing 300. The timing controller shield 113 may minimize interference between the timing controller board 121 and the power supply board 107. Further, the timing controller shield 113 may protect the timing controller board 121 from an impact.

The timing controller shield 113 may be formed of metal material and may be coupled with the housing 300 using at least one screw 221.

Figure 25:
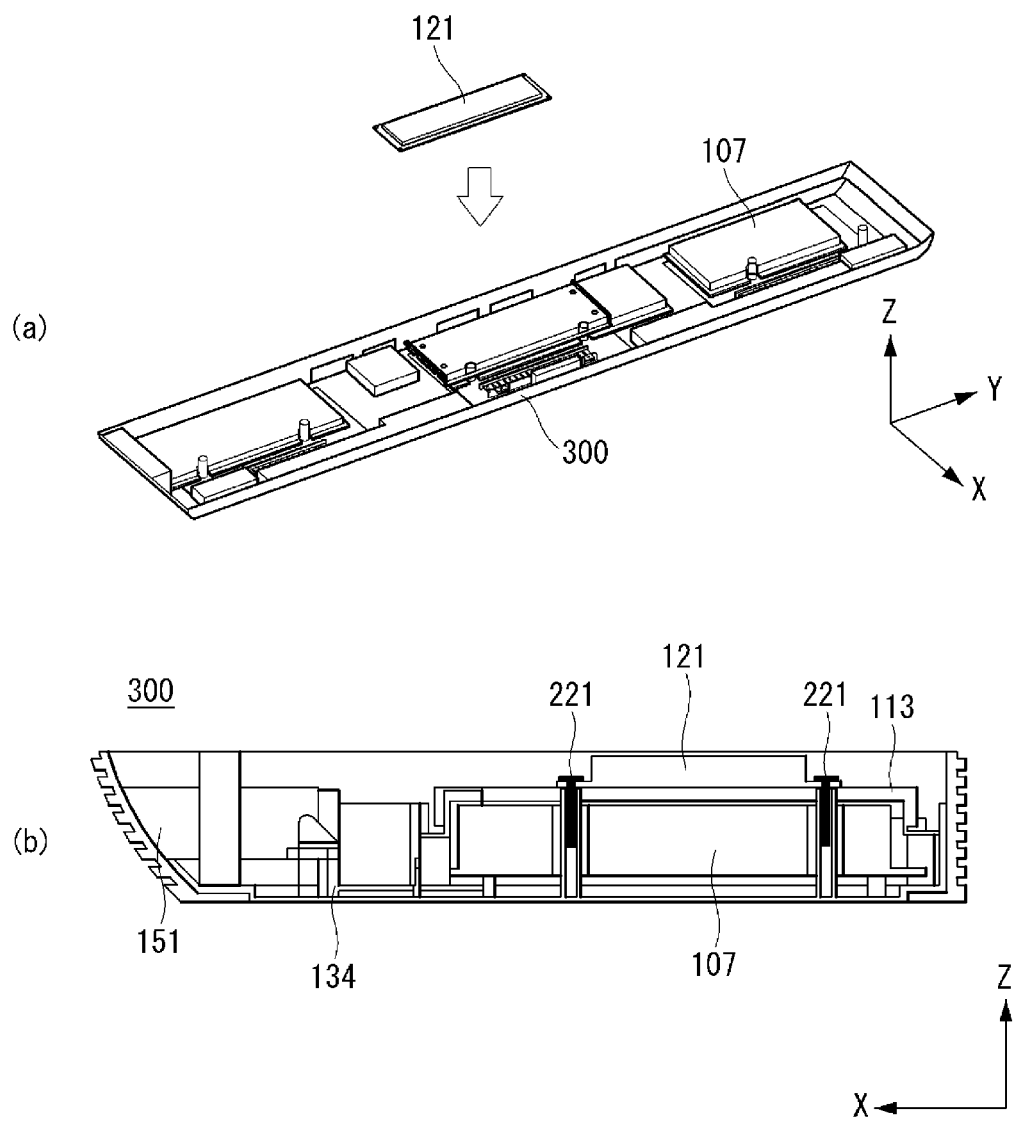

Next, as shown in FIG. 25, the timing controller board 121 may be coupled on the timing controller shield 113. The timing controller board 121 may be coupled with the upper part of the power supply board 107 and may save a space. Although not shown, the timing controller board 121 may be connected to the power supply board 107 and may help in driving the timing controller board 121.

Figure 26:
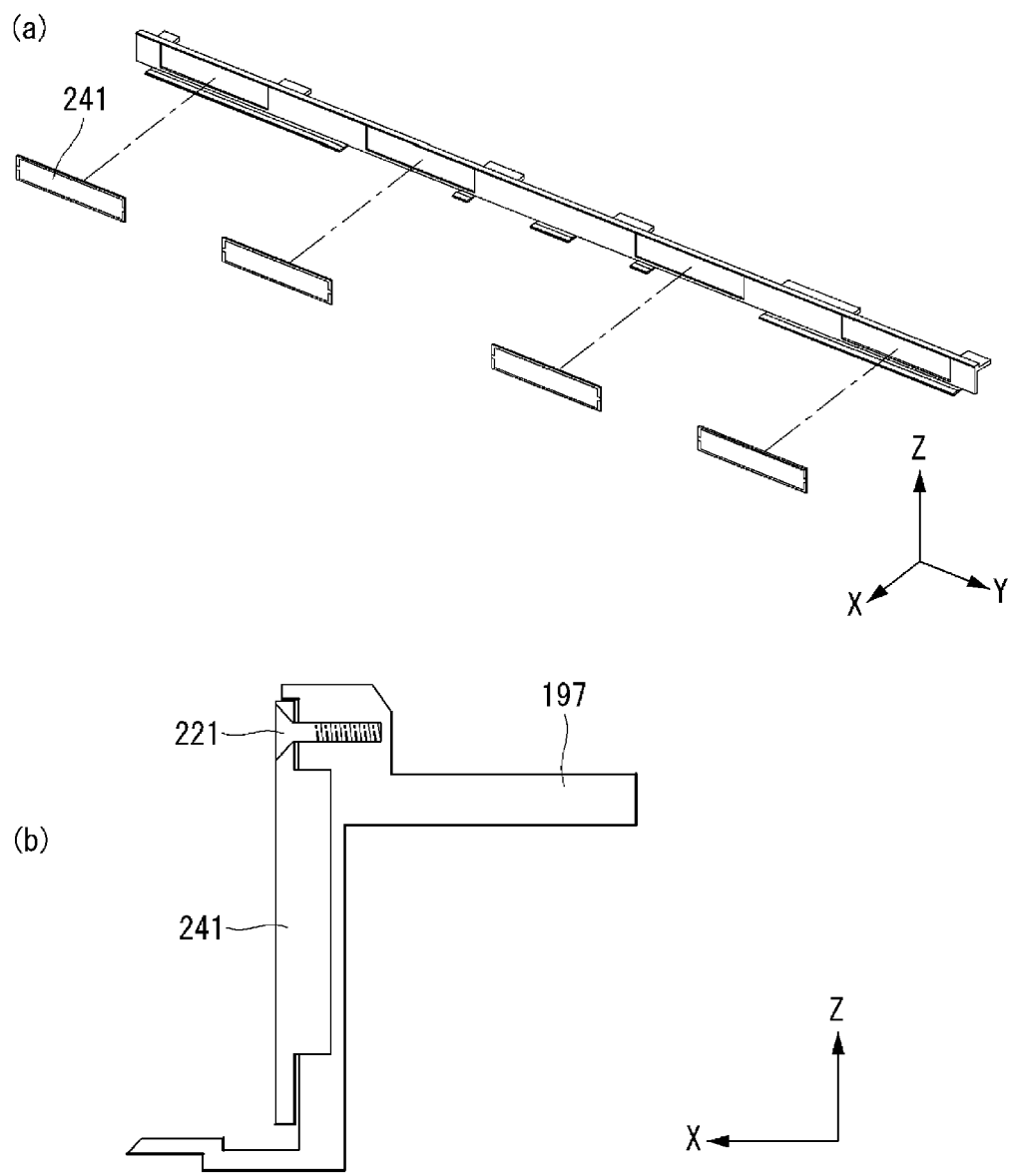

Next, as shown in FIG. 26, the fixers 241 may be coupled with the opening of the link bar 197. The fixers 241 may be separated from one another and may be individually coupled with the link bar 197. The fixers 241 may be coupled with the link bar 197 using at least one screw 221. As the area of the link bar 197 occupied by the fixer 241 increases, the link bar 197 may be more strongly coupled with the back cover 200.

Figure 27:
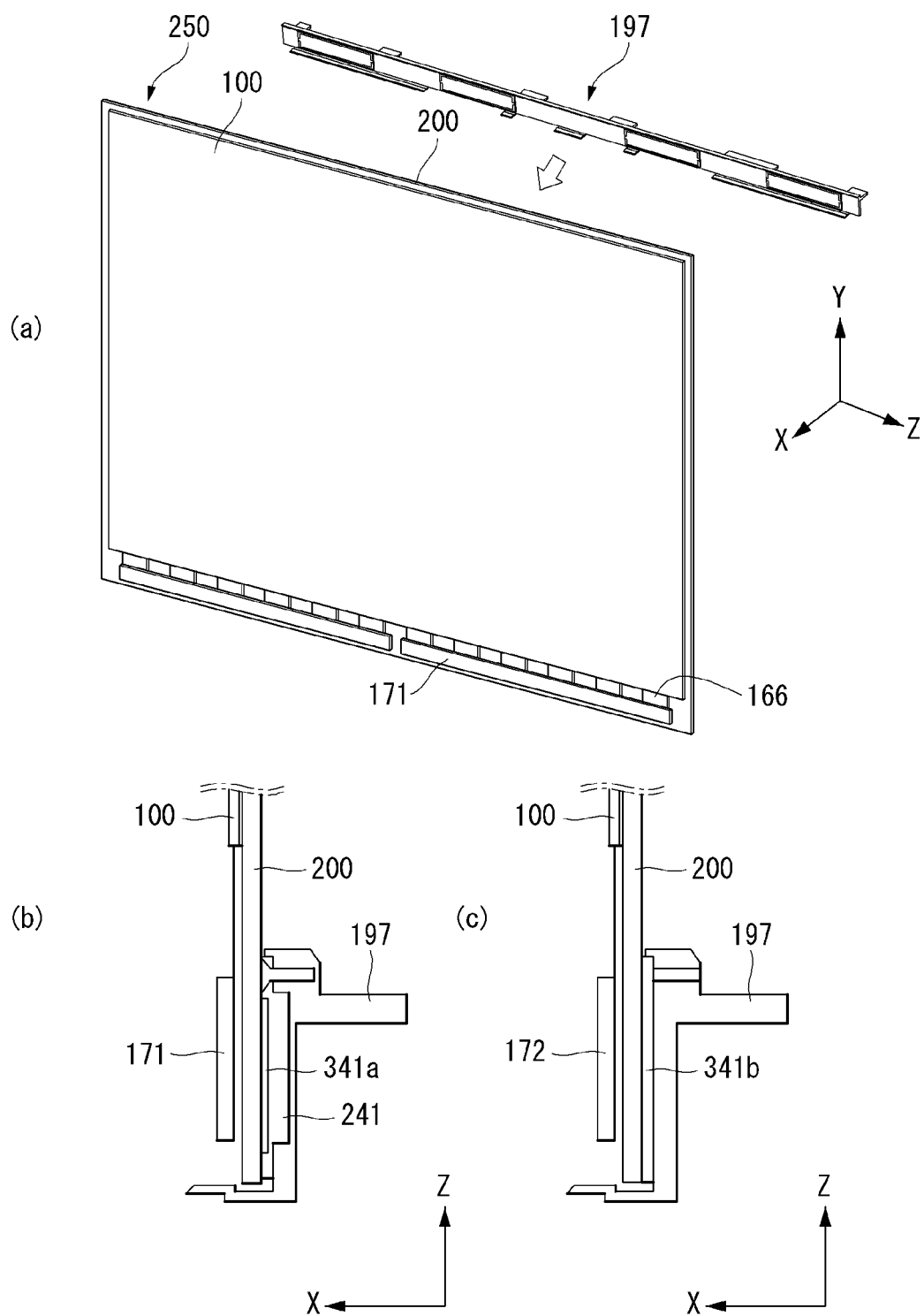

Next, as shown in FIG. 27, the link bar 197 may be attached to the display unit 250. More specifically, the link bar 197 may be attached to a back lower portion of the back cover 200. As described above, the link bar 197 may be attached to the back cover 200 using the first adhesive layer 341a in an area, in which the fixer 241 is positioned, and may be attached to the back cover 200 using the second adhesive layer 341b in an area, in which the fixer 241 is not positioned.

Figure 28:
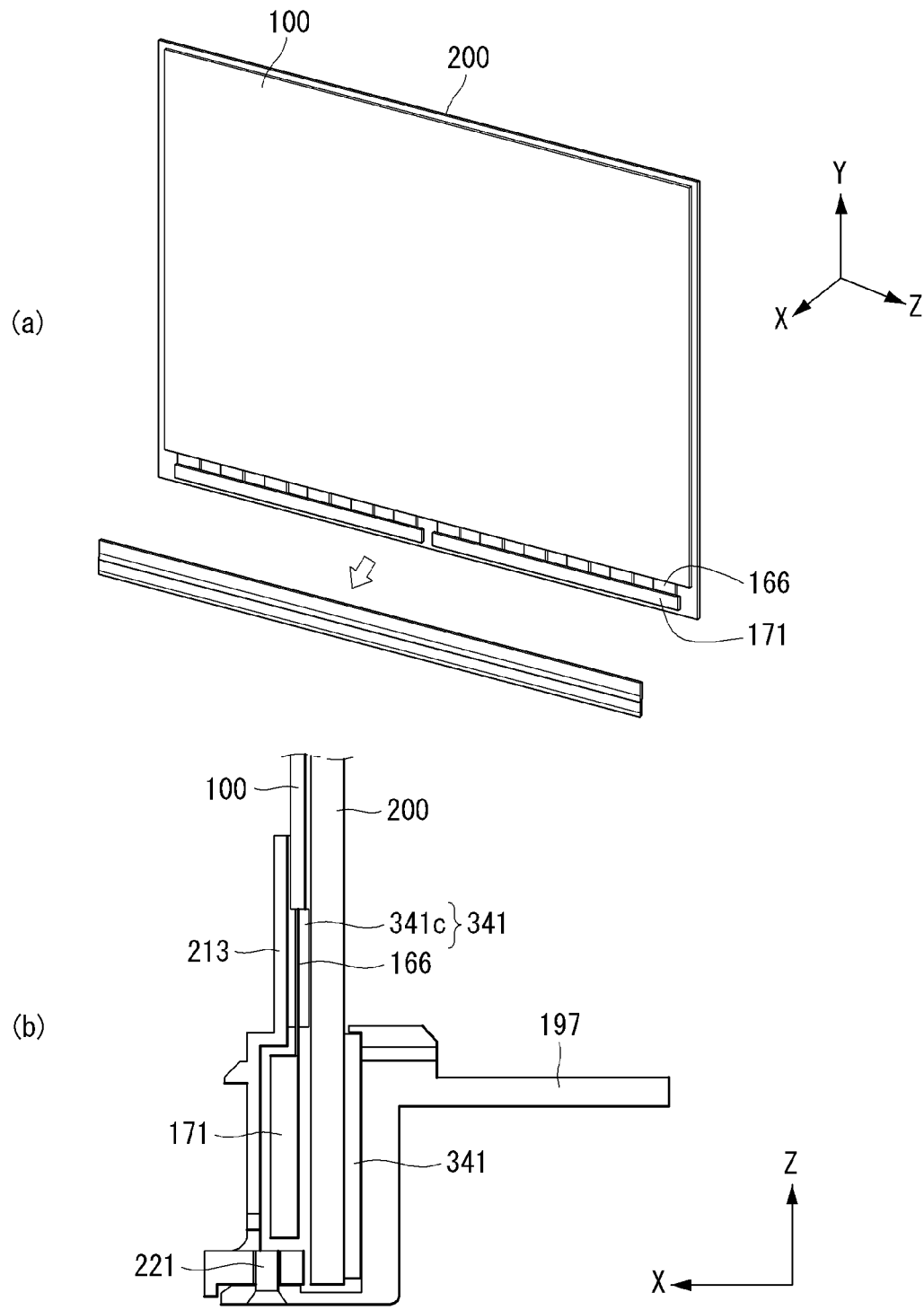

Next, as shown in FIG. 28, the front deco 213 may be attached to the display unit 250. More specifically, the front deco 213 may be attached to a front lower portion of the display unit 250.

At the front lower portion of the display unit 250, the display panel 100 may be connected to the source PCB 171 through the source COFs 166. The source COFs 166 may be separated from one another by a predetermined distance in the lower part of the display panel 100.

The front deco 213 may be attached to the back cover 200 in a separation area (in which the source COF 166 is not positioned) between the source COFs 166. The front deco 213 may be attached to the back cover 200 using a third adhesive layer 341c. The third adhesive layer 341c may be a double-sided tape. A thickness of the third adhesive layer 341c may be greater than a thickness of the source COF 166 so that the third adhesive layer 341c contacts the front deco 213.

Because the front deco 213 is attached to the back cover 200 through the third adhesive layer 341c and is connected to the link bar 197 through the screw, the front deco 213 may be more strongly coupled with the display unit 250. Both the front deco 213 and the link bar 197 may be more strongly coupled with the back cover 200 using the first to third adhesive layers 341a, 341b, and 341c. Hence, even if an external force is applied to the back cover 200, it may be difficult to separate the front deco 213 and/or the link bar 197 from the back cover 200. Further, even if the external force is applied to the back cover 200, the front deco 213 and the link bar 197 may support the back cover 200. Thus, the back cover 200 may scarcely bend.

Figure 29:
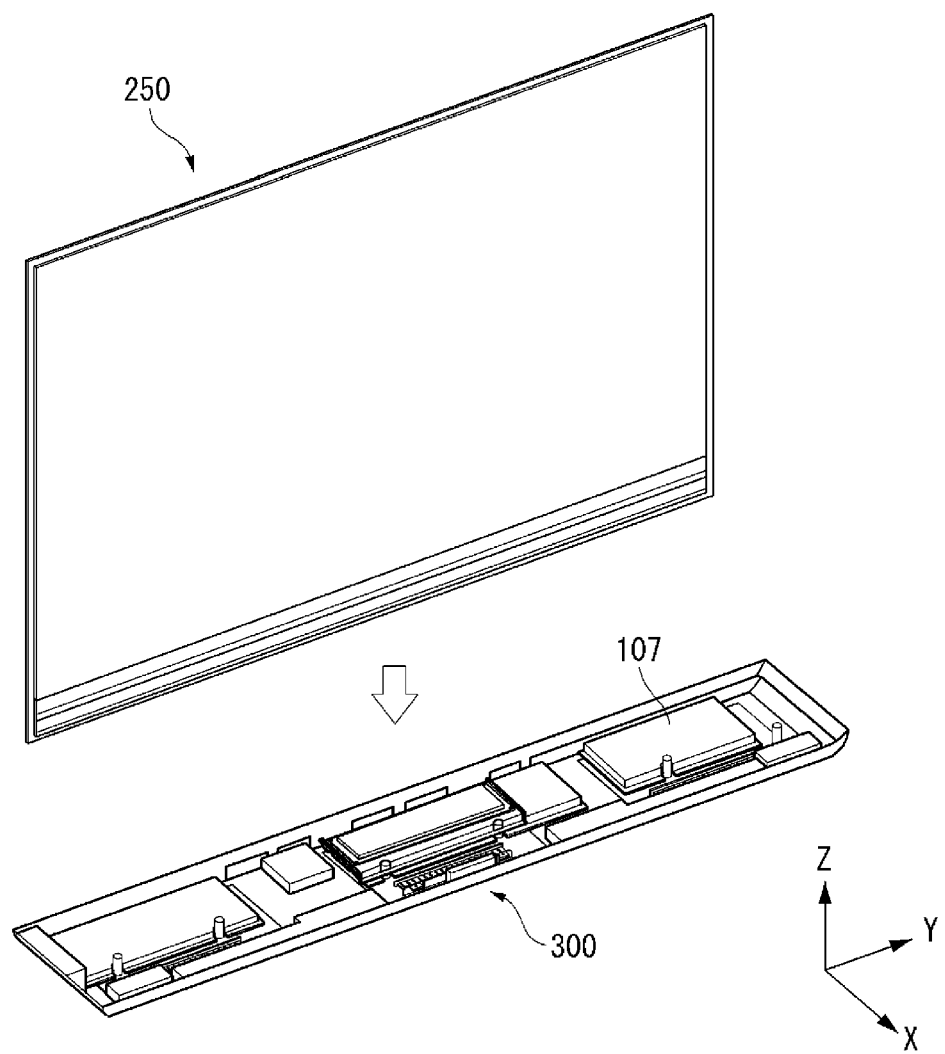

Next, as shown in FIG. 29, the display unit 250 may be inserted into the housing 300. More specifically, the lower portion of the display unit 250 may be inserted into the tension bracket 134 of the housing 300. The display unit 250 may be coupled with the housing 300 through the link bar 197 shown in FIG. 7. Namely, the link bar 197 may be coupled with the housing 300 through at least one screw.

Figure 30:
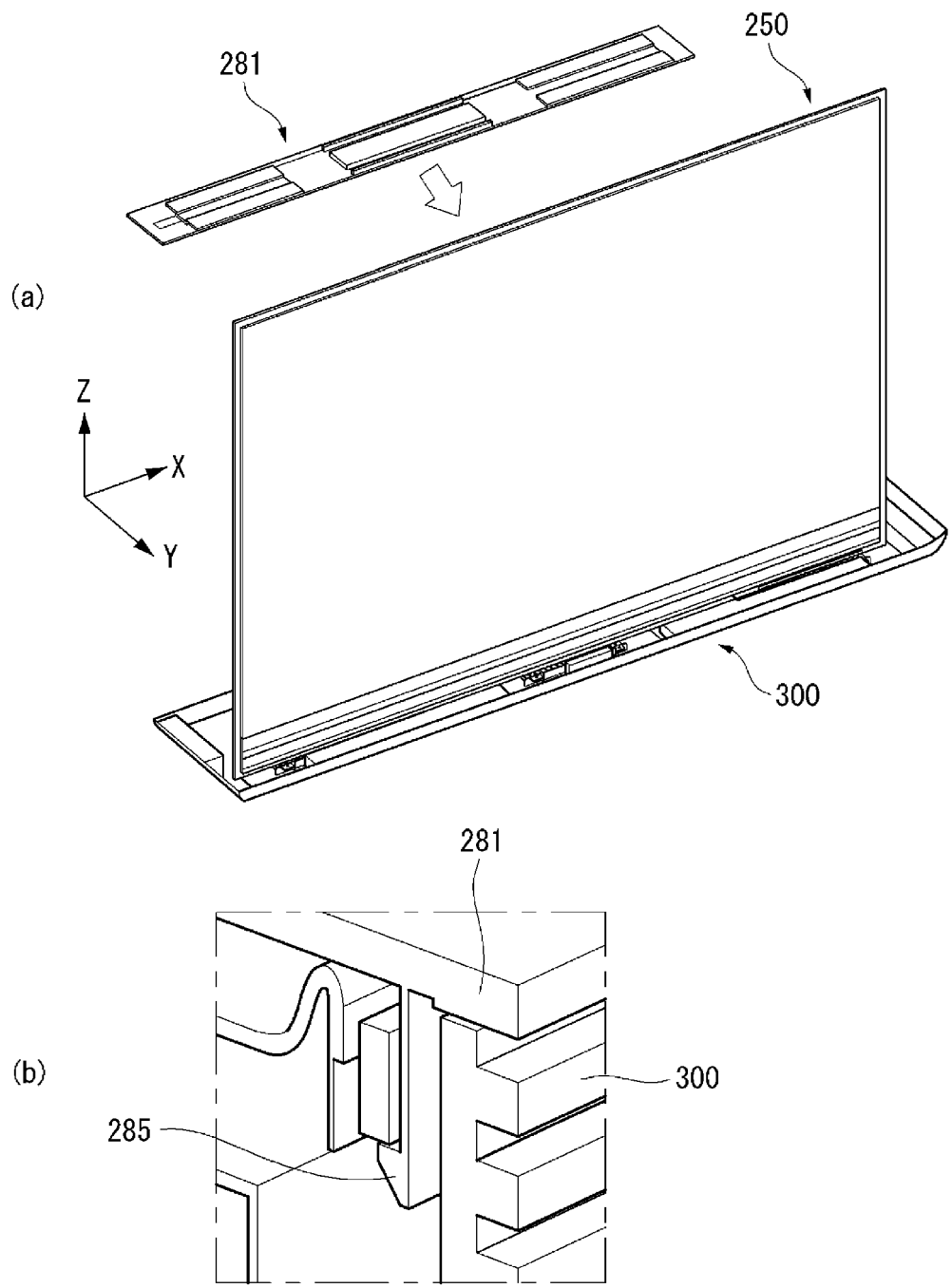

Next, as shown in FIG. 30, the rear cover 281 may cover a back portion of the housing 300. The rear cover 281 may shield the components mounted on the back portion of the housing 300. The rear cover 281 may include a metal rear cover and a mold rear cover, so as to block electromagnetic waves emitted from at least one PCB positioned at a back portion of the housing 300. Other configurations may be used. For example, the rear cover 281 may be formed of only a conductive material.

The rear cover 281 may be coupled with the housing 300 through the rear hook 285. More specifically, the rear cover 281 may be coupled with the housing 300 by hanging the rear hook 285 to one end of the housing 300. FIG. 30 shows only the rear hook 285 positioned at a back portion of the rear cover 281. However, as shown in FIG. 8, the rear hook 285 may be positioned at a front portion of the rear cover 281.

Because the rear cover 281 is coupled with the housing 300 using not the screw but the rear hook 285, the user may feel an improvement of the appearance of the display device.

Figure 31:
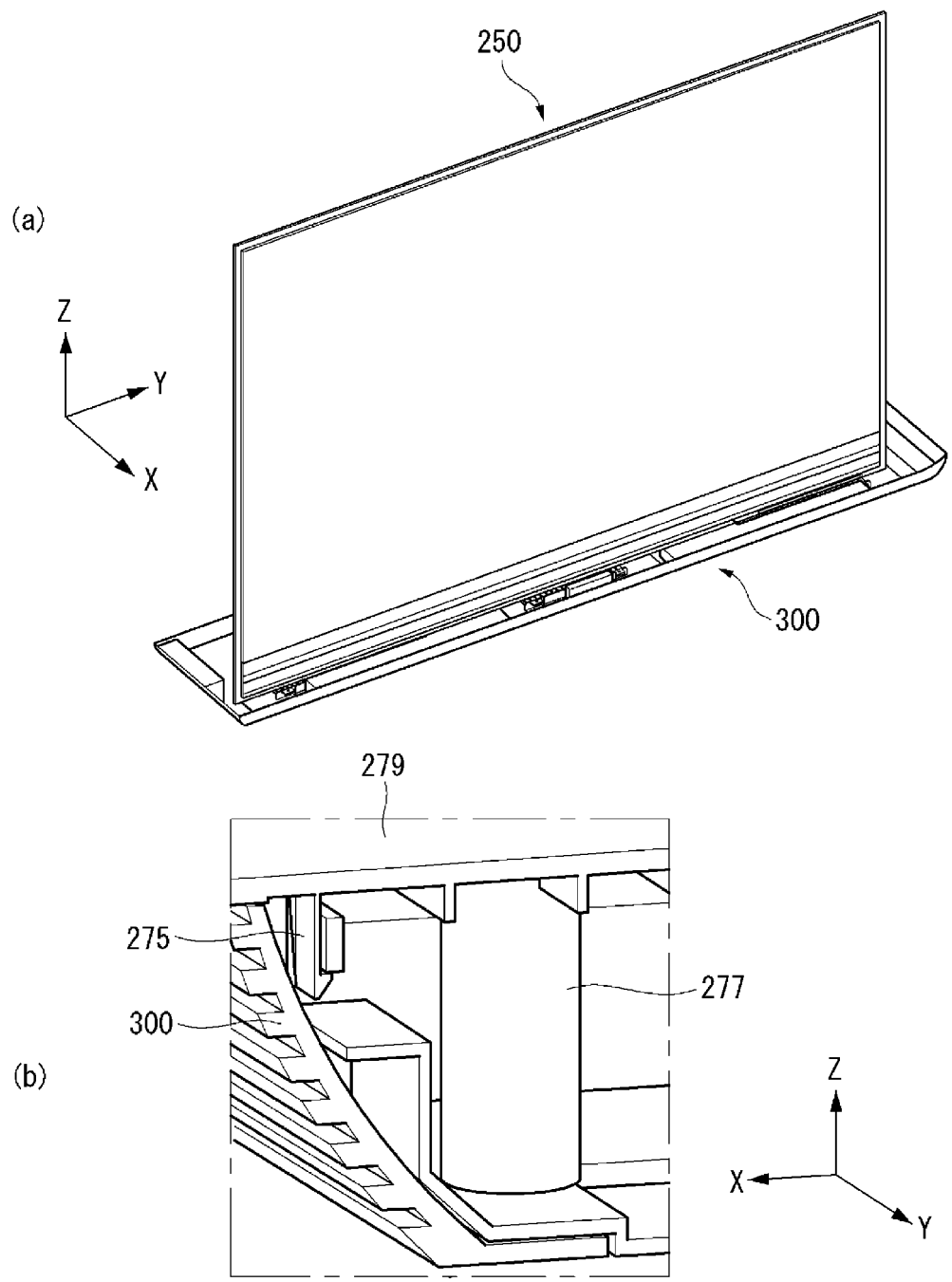

Finally, as shown in FIG. 31, the front cover 279 may cover a front portion of the housing 300. The front cover 279 may shield the components mounted on the front portion of the housing 300. The front cover 279 may be coupled with the housing 300 through the front hook 275. FIG. 31 shows only the front hook 275 positioned at a front portion of the front cover 279. However, as shown in FIG. 8, the front hook 275 may be positioned at a back portion of the front cover 279.

Further, the front cover 279 may include a support 277 extending to the bottom of the housing 300. The support 277 may contact the bottom of the housing 300 when the front cover 279 is coupled with the housing 300. Hence, even if an external impact is applied to the front cover 279, the front cover 279 may not bend.

Because the front cover 279 is coupled with the housing 300 using not the screw but the front hook 275 in the same manner as the rear cover 281, the user may concentrate on watching the display screen without the hindrance.

Figure 32:
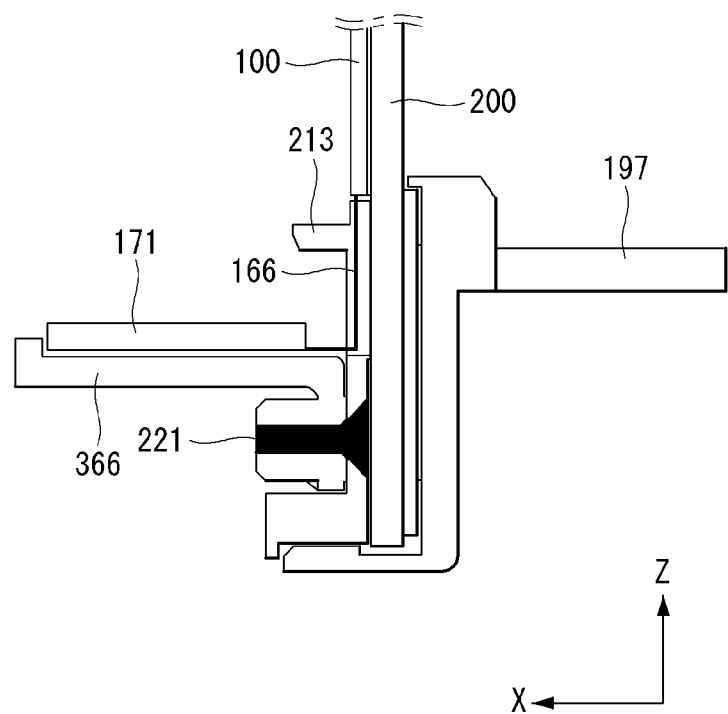
FIGS. 32 and 33 illustrate a display device according to another example embodiment of the invention.
Figure 33:
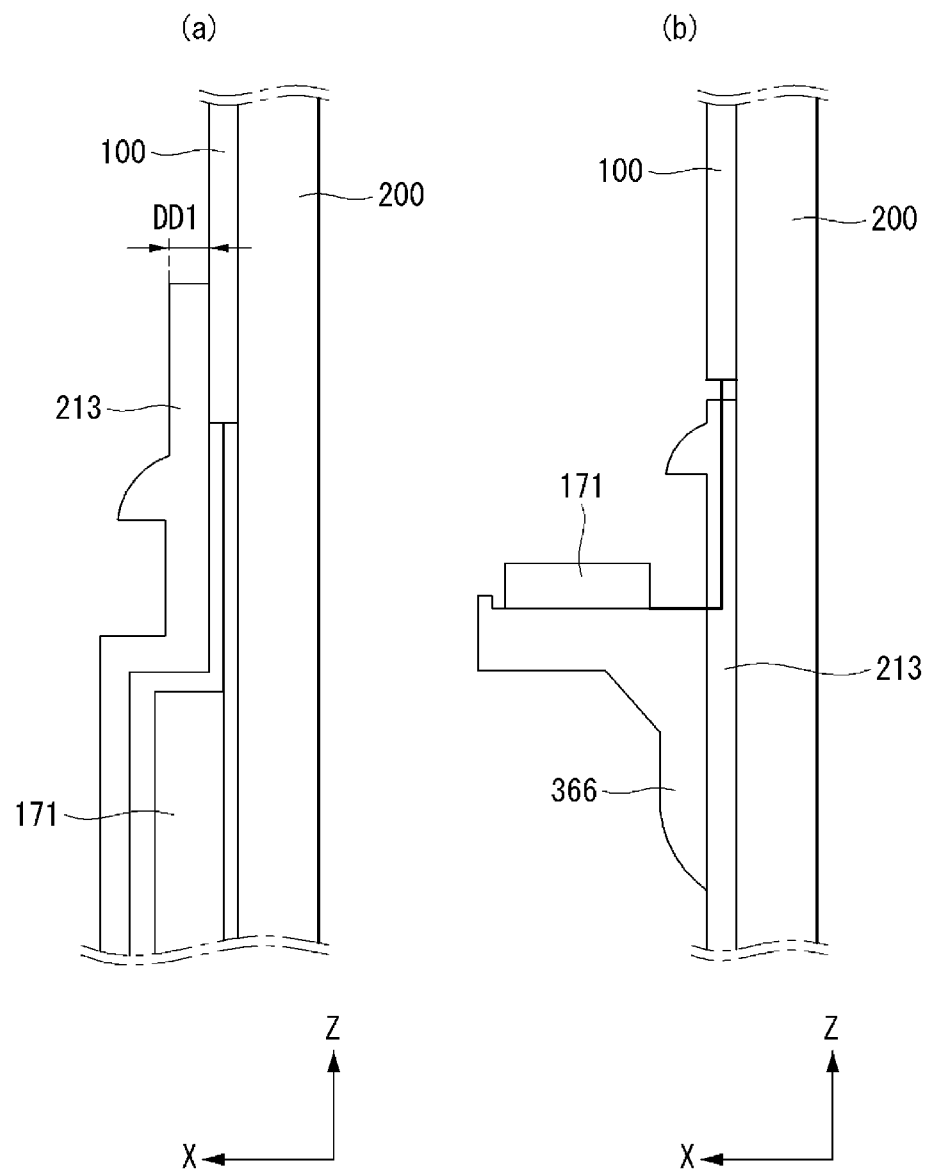

FIGS. 32 and 33 illustrate a display device according to another example embodiment of the invention.

Referring to FIG. 32, a source PCB 171 of a display device according to another example embodiment of the invention may be positioned at a PCB bracket 366 coupled with a front deco 213. The source PCB 171 may rotate by 90° and may be positioned on an upper surface of the PCB bracket 366. Namely, the side of the source PCB 171 may be positioned on the upper surface of the PCB bracket 366. Because the source PCB 171 lies on the PCB bracket 366, a space in a height direction (for example, Z-axis direction) may be saved.

The PCB bracket 366 may be coupled with the front deco 213 using at least one screw 221. Because the source PCB 171 is positioned on the PCB bracket 366, the front deco 213 may not cover the source PCB 171. Hence, the front deco 213 according to the embodiment of the invention may perform only a function preventing a back cover 200 from forwardly bending.

Referring to (a) of FIG. 33, a front deco 213 of an existing display device was positioned at a front surface of a display panel 100, so as to cover a source PCB 171. Hence, the front deco 213 protruded to the front surface of the display panel 100 by a first distance DD 1. Hence, a height difference between the front deco 213 and the display panel 100 was generated in a lower part of a display unit, and the user was hindered from concentrating on the display screen.

On the other hand, referring to (b) of FIG. 33, the display device according to the embodiment of the invention may cause not the front deco 213 but the PCB bracket 366 to protect the source PCB 171. Hence, the front deco 213 may be positioned on a lower part of a display panel 100. Namely, the front deco 213 may not protrude to a front surface of the display panel 100. A front surface of the front deco 213 and the front surface of the display panel 100 may be positioned in a straight line. Because the front deco 213 does not protrude to the front surface of the display panel 100, the user can further concentrate on the display screen. Further, because the front deco 213 is positioned on the lower part of the display panel 100, the front deco 213 may be shielded by a housing 300.

FIGS. 34 to 37 illustrate a method for coupling components of a display device according to another example embodiment of the invention.

Figure 34:
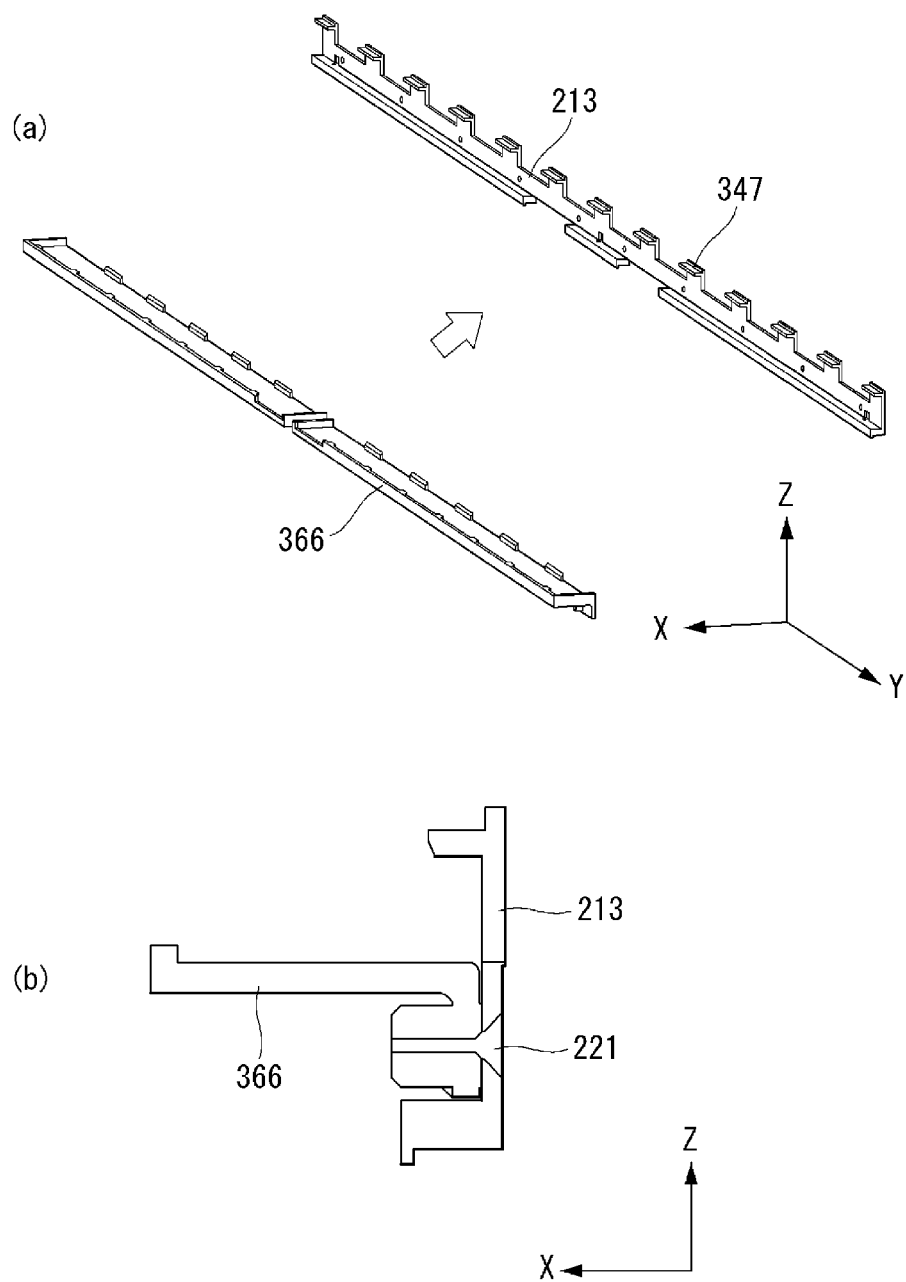
FIGS. 34 to 37 illustrate a method for coupling components of a display device according to another example embodiment of the invention.

As shown in FIG. 34, the front deco 213 may be coupled with the PCB bracket 366. The front deco 213 may include a plurality of latches 347 which are separated from one another in the longitudinal direction (for example, the Y-axis direction) by a predetermined distance and protrude forwardly (for example, in the X-axis direction). The plurality of latches 347 may be coupled with a front cover covering an upper surface of the housing 300.

The front deco 213 may be coupled with the PCB bracket 366 using at least one screw 221. The PCB bracket 366 may be in plural so as to store the plurality of source PCBs 171. Other configurations may be used. For example, one PCB bracket 366 may store the plurality of source PCBs 171.

Figure 35:
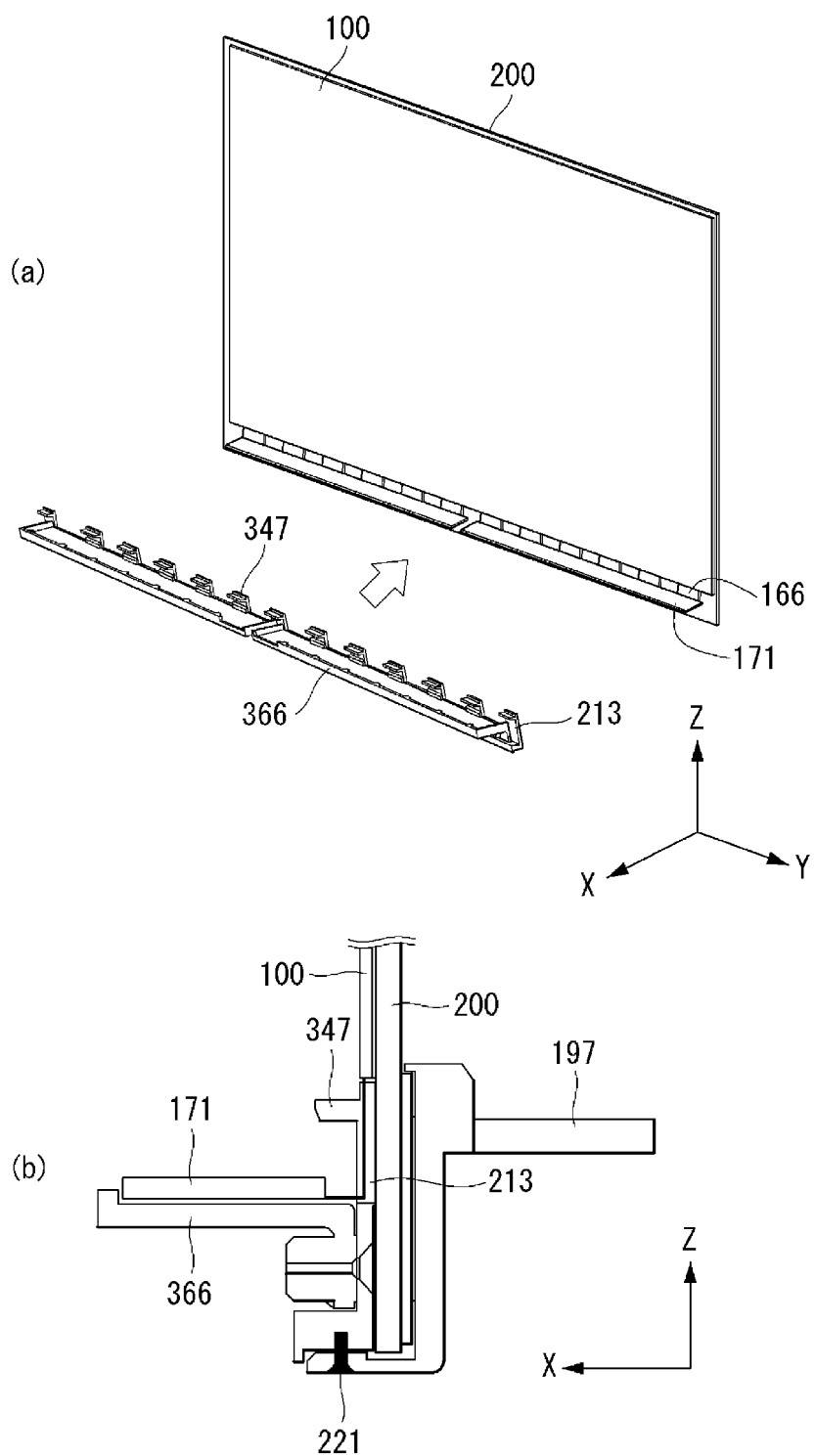

Next, as shown in FIG. 35, the front deco 213 coupled with the PCB bracket 366 may be attached to the display unit 250. The front deco 213 may be attached to the back cover 200. More specifically, the front deco 213 may be attached to the back cover 200 in an area, in which there is no source COF 166 electrically connecting the source PCB 171 to the display panel 100. The front deco 213 may be attached to the back cover 200 through an area, in which there is no source COF 166 positioned under the display panel 100. For example, the front deco 213 may be attached to the back cover 200 using a double-sided tape.

The front deco 213 may be coupled with a link bar 197. More specifically, an extended portion of the link bar 197 may be coupled with a lower surface of the front deco 213 using at least one screw 221.

The front deco 213 may be coupled with the link bar 197 connected to the housing 300 and also may be coupled with the back cover 200. As a result, the front deco 213 may more strongly couple the back cover 200 to the housing 300.

Figure 36:
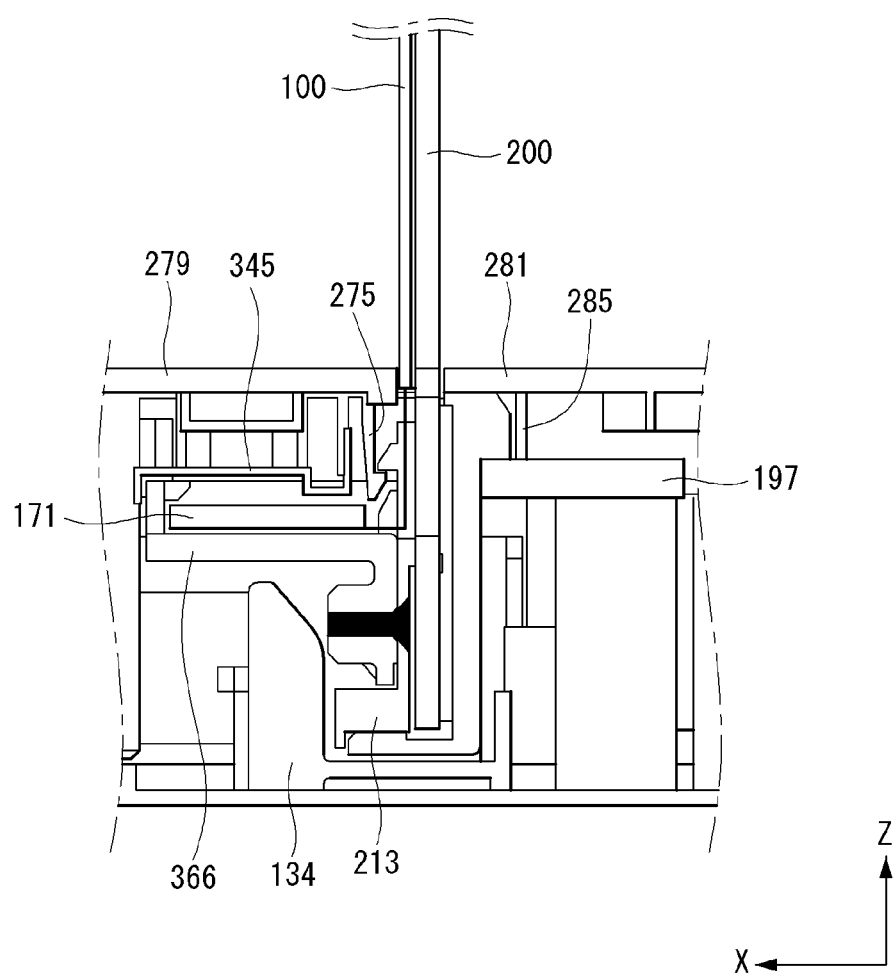

Next, as shown in FIG. 36, a PCB shield 345 may be assembled on the PCB bracket 366. The PCB shield 345 may block electromagnetic waves emitted from the source PCB 171. Hence, the PCB shield 345 may include a conductive material.

The PCB shield 345 may have a heat dissipation function. Namely, because the PCB shield 345 includes a material with high thermal conductivity, heat emitted from the source PCB 171 may be dissipated.

The front deco 213 and the PCB bracket 366 may be positioned inside the housing 300. Namely, a front cover 279 and a rear cover 281 may not be exposed to the outside. Hence, because the user can watch only the display screen, the user can further concentrate on the display screen.

Figure 37:
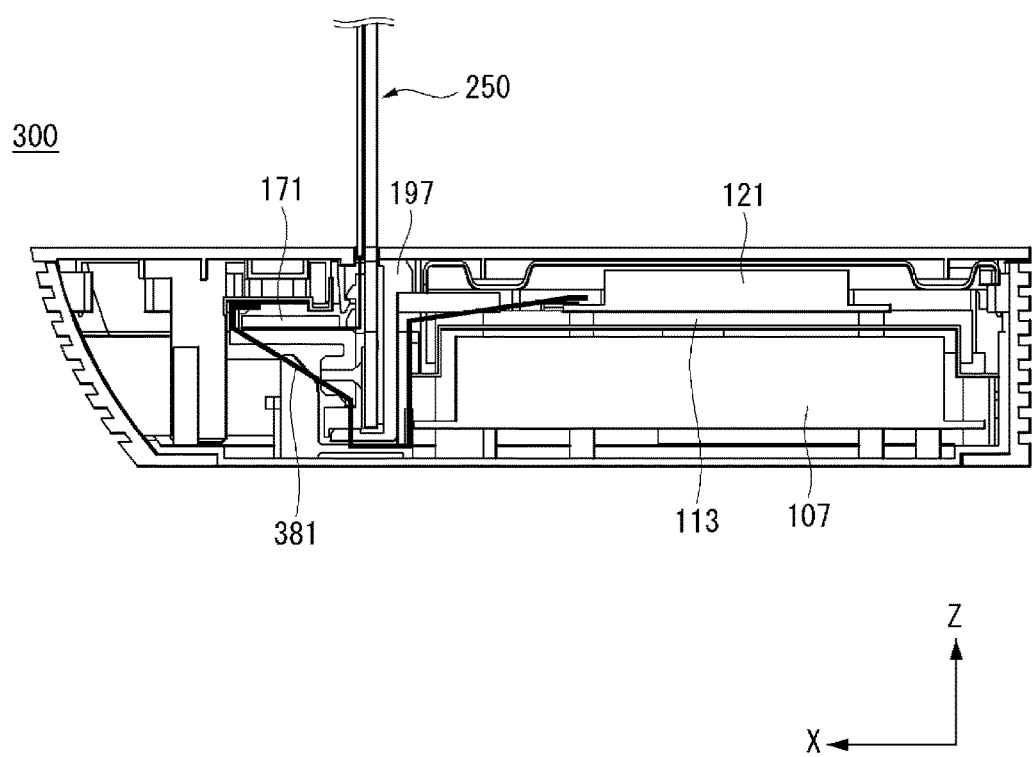

Finally, as shown in FIG. 37, a flat flexible cable 381 may be connected to the source PCB 171 and a timing controller board 121. Because the display unit 250 is positioned between the source PCB 171 and the timing controller board 121, the flat flexible cable 381 may pass through a front surface of the PCB bracket 366 and then pass between a lower part of the display unit 250 and a bottom surface of the housing 300, thereby being connected to the timing controller board 121.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a display unit including a display panel and a back cover positioned behind the display panel;
   a housing receiving a lower portion of the display unit;
   a tension bracket in the housing, the tension bracket positioned between the display panel and a lower surface of the housing; and
   a link bar in the housing, the link bar including a body portion attached to a rear surface of the back cover and an extension portion protruding from the body portion, wherein the extension portion is fixed to the housing.

2. The display device of claim 1, wherein the tension bracket includes:
   a receiving portion, on which the display unit is mounted;
   a guide portion protruding from one side of the receiving portion in a vertical direction of the tension bracket and inclined toward the receiving portion, wherein the guide portion includes two ends positioned along a longitudinal direction of the tension bracket; and
   fastening portions respectively positioned at the two ends of the guide portion and extending in a transversal direction of the tension bracket, the fastening portions coupling with the housing.

3. The display device of claim 2, wherein the receiving portion includes at least one groove,
   wherein the at least one groove extends in the transversal direction of the tension bracket, and
   wherein if the at least one groove comprises a plurality of grooves, the plurality of grooves are separated from one another by a predetermined distance along the longitudinal direction of the tension bracket.

4. The display device of claim 2, wherein the receiving portion is separated from the housing by a predetermined distance.

5. The display device of claim 2, wherein an upper surface of the guide portion is round in shape.

6. The display device of claim 2, wherein the fastening portions are coupled with the housing by at least one screw.

7. The display device of claim 1, wherein the tension bracket comprises a plurality of tension brackets, and
   wherein the plurality of tension brackets are separated from one another by a predetermined distance along a longitudinal direction of the housing.

8. The display device of claim 7, wherein a width of one of the plurality of tension brackets positioned in a middle of the plurality of tension brackets is greater than a width of other tension brackets of the plurality of tension brackets.

9. The display device of claim 1, wherein the tension bracket comprises a material with high elasticity.

10. The display device of claim 1, wherein at least a portion of the link bar is positioned between a lower portion of the display unit and the tension bracket.

11. The display device of claim 1, wherein a printed circuit board lies on the housing in a direction that is perpendicular to an extending direction of the display panel.

12. The display device of claim 1, further comprising:
    a front cover covering an upper surface of the housing at a front surface of the display unit; and
    a rear cover covering the upper surface of the housing at a back surface of the display unit.

13. The display device of claim 12, wherein the front cover includes a front hook protruding toward the bottom surface of the housing to couple the front cover with the housing, and wherein the rear cover includes a rear hook protruding toward the bottom surface of the housing to couple the rear cover to the housing.

14. The display device of claim 12, wherein the front cover includes a support that protrudes toward the bottom surface of the housing and contacts the bottom surface of the housing.

15. The display device of claim 1, further comprising a cushion positioned between the tension bracket and the link bar to absorb impact.

16. The display device of claim 1, further comprising a cushion positioned between the link bar and the back cover to absorb impact.

17. The display device of claim 1, wherein the back cover comprises a transparent material.

18. The display device of claim 1, further comprising a first cushion positioned between the tension bracket and the link bar to absorb impact and a second cushion positioned between the link bar and the back cover to absorb impact.

* * * * *